(12) United States Patent
Yoo

(10) Patent No.: US 11,069,746 B2
(45) Date of Patent: Jul. 20, 2021

(54) ELECTRONIC DEVICE

(71) Applicant: SK hynix Inc., Icheon (KR)

(72) Inventor: Myoung Sul Yoo, Icheon (KR)

(73) Assignee: SK hynix Inc., Icheon (KR)

( * ) Notice: Subject to any disclaimer, the term of this patent is extended or adjusted under 35 U.S.C. 154(b) by 26 days.

(21) Appl. No.: 16/657,602

(22) Filed: Oct. 18, 2019

(65) Prior Publication Data

US 2020/0350367 A1    Nov. 5, 2020

(30) Foreign Application Priority Data

May 3, 2019    (KR) .................. 10-2019-0052473

(51) Int. Cl.
| | | |
|---|---|---|
| *H01L 27/24* | (2006.01) | |
| *H01L 23/528* | (2006.01) | |
| *H01L 27/22* | (2006.01) | |
| *H01L 43/02* | (2006.01) | |
| *H01L 45/00* | (2006.01) | |

(52) U.S. Cl.
CPC .......... *H01L 27/249* (2013.01); *H01L 23/528* (2013.01); *H01L 27/222* (2013.01); *H01L 43/02* (2013.01); *H01L 45/06* (2013.01); *H01L 45/08* (2013.01); *H01L 45/1233* (2013.01); *H01L 45/144* (2013.01); *H01L 45/146* (2013.01); *H01L 45/147* (2013.01)

(58) Field of Classification Search
CPC ... H01L 27/249; H01L 27/222; H01L 23/528; H01L 45/06; H01L 45/08; H01L 45/1233; H01L 45/144–147
See application file for complete search history.

(56) References Cited

U.S. PATENT DOCUMENTS

| | | | | |
|---|---|---|---|---|
| 9,691,475 B2 * | 6/2017 | Redaelli | ................ | H01L 45/141 |
| 10,147,764 B2 * | 12/2018 | Redaelli | .............. | H01L 27/2427 |
| 2010/0270529 A1 * | 10/2010 | Lung | ................... | H01L 45/1683 257/4 |
| 2013/0256625 A1 * | 10/2013 | Lee | ..................... | H01L 45/1233 257/5 |
| 2016/0118113 A1 * | 4/2016 | Siau | ....................... | H01L 45/06 365/51 |
| 2016/0379707 A1 | 12/2016 | Yang et al. | | |
| 2018/0122860 A1 * | 5/2018 | Redaelli | .............. | H01L 27/2427 |

FOREIGN PATENT DOCUMENTS

KR    1020170100160 A    9/2017

* cited by examiner

*Primary Examiner* — Christine A Enad

(57) ABSTRACT

A semiconductor memory includes: first column lines extending in a first direction; first row lines extending in a second direction; first memory cells located between the first row lines and the first column lines; second column lines electrically connected to the first column lines; second row lines extending in the second direction; and second memory cells located between the second row lines and the second column lines. The first column lines and the second column lines may overlap with each other in a third direction. In a first region, current paths on the second row lines are shorter than current paths on the second row lines in a second region. An overlapping ratio of a second column line belonging to the first region with a first column line may be smaller than that of a second column line belonging to the second region with another first column line.

20 Claims, 22 Drawing Sheets

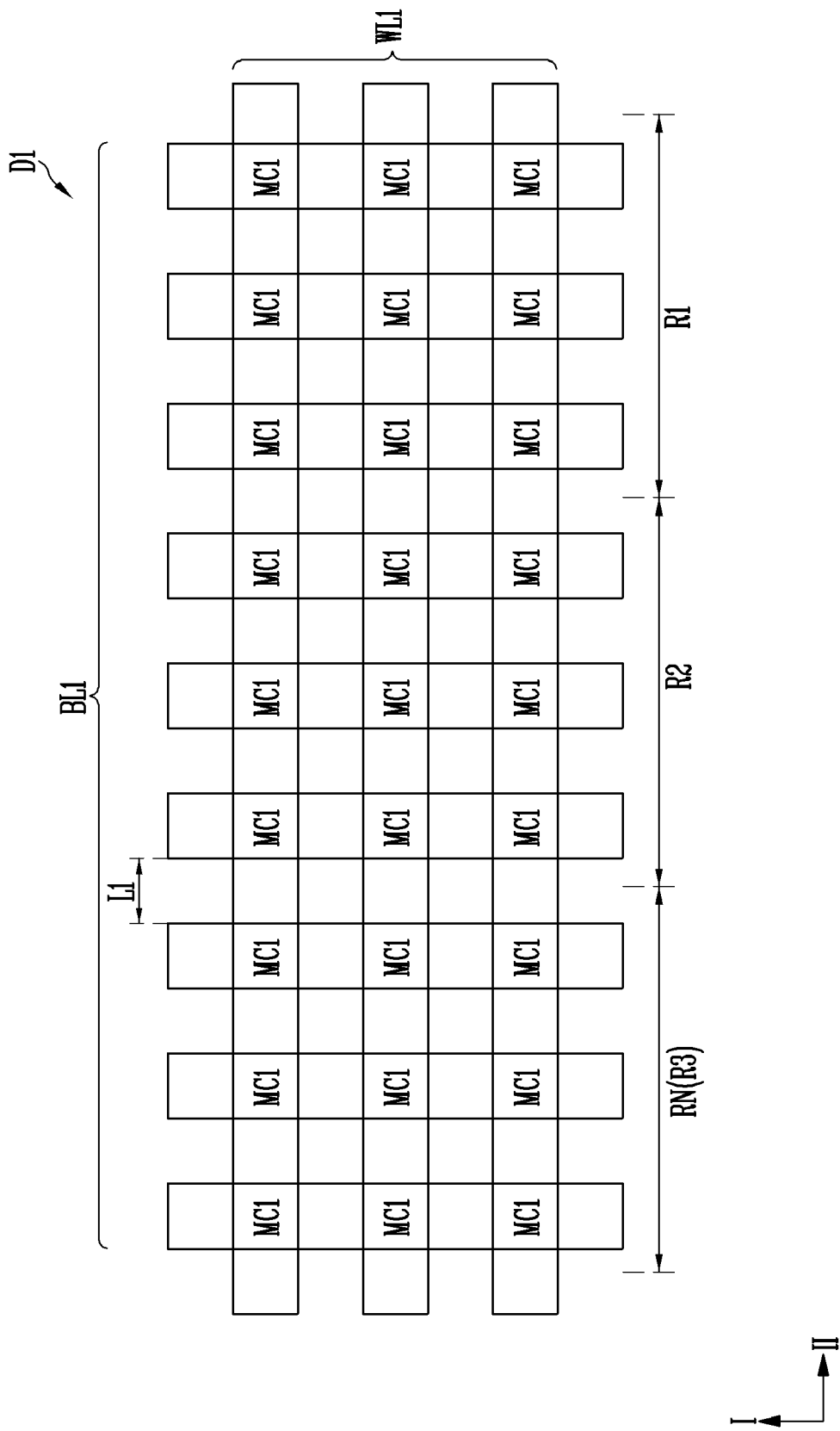

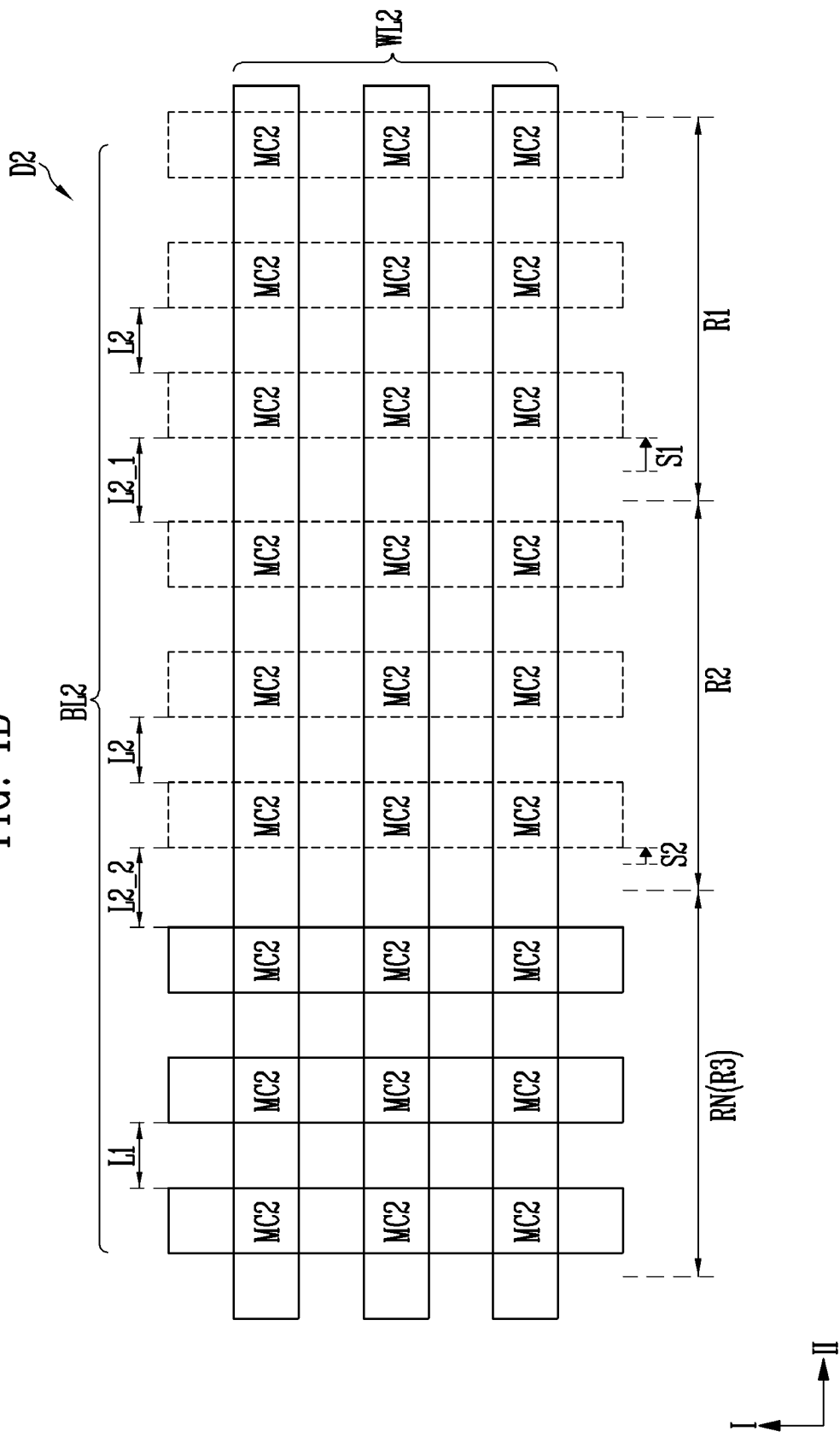

ELECTRONIC DEVICE

CROSS-REFERENCE TO RELATED APPLICATION

The present application claims priority under 35 U.S.C. § 119(a) to Korean patent application number 10-2019-0052473, filed on May 3, 2019, in the Korean Intellectual Property Office, the entire disclosure of which is incorporated herein by reference.

BACKGROUND

1. Technical Field

The present disclosure generally relates to a memory circuit or device, and an application thereof in an electronic device.

2. Related Art

Recently, as electronic devices or appliances trend toward miniaturization, low power consumption, high performance, multi-functionality, and so on, there has been a demand for electronic devices capable of storing information in various electronic devices or appliances such as a computer and a portable communication device. Thus, research has been conducted for the semiconductor devices capable of storing data using a characteristic that they are switched between different resistant states according to an applied voltage or current. Examples of the semiconductor devices are a resistive random access memory (RRAM), a phase change random access memory (PRAM), a ferroelectric random access memory (FRAM), a magnetic random access memory (MRAM), an E-fuse, and the like.

SUMMARY

Embodiments provide an electronic device capable of improving the operational characteristics and reliability of memory cells.

In accordance with an aspect of the present disclosure, there is provided an electronic device including a semiconductor memory, wherein the semiconductor memory includes: first column lines extending in a first direction; first row lines extending in a second direction intersecting the first direction; first memory cells located between the first row lines and the first column lines; second column lines electrically connected to the first column lines, the second column lines extending in the first direction; second row lines extending in the second direction; and second memory cells located between the second row lines and the second column lines, wherein the first column lines and the second column lines overlap with each other in a third direction intersecting the first direction and the second direction, wherein a first second column line belongs to a region in which current paths on the second row lines are shorter than current paths on the second row lines in a region a second second column line belongs to, and wherein an overlapping ratio of the first second column line with a first first column line is smaller than an overlapping ratio of the second second column line with a second first column line.

In accordance with another aspect of the present disclosure, there is provided an electronic device including a semiconductor memory, wherein the semiconductor memory includes: first column lines extending in a first direction; first row lines extending in a second direction intersecting the first direction; first memory cells located between the first row lines and the first column lines; second column lines electrically connected to the first column lines, the second column lines extending in the first direction; second row lines extending in the second direction; and second memory cells located between the second row lines and the second column lines, wherein the first memory cells and the second memory cells overlap with each other in a third direction intersecting the first and second directions, wherein a first second memory cell belongs to a region in which current paths on the second row lines are shorter than current paths on the second row lines in a region which a second second memory cell belongs to, and wherein an overlapping ratio of the first second memory cell with a first first memory cell is smaller than an overlap ratio of the second second memory cell with a second first memory cell.

In accordance with still another aspect of the present disclosure, there is provided an electronic device including a semiconductor memory, wherein the semiconductor memory includes: first column lines extending in a first direction; first row lines extending in a second direction intersecting the first direction; first memory cells located between the first row lines and the first column lines; second column lines electrically connected to the first column lines, the second column lines extending in the first direction; second row lines extending in the second direction; and second memory cells located between the second row lines and the second column lines, wherein the first column lines and the second column lines overlap with each other in a third direction intersecting the first direction and the second direction, wherein a first region to an nth region are defined based on the length of a current path, wherein an overlapping ratio of first and second column lines belonging to the first region in which the current path is short relative to a current path of the nth region is smaller than an overlapping ratio of first and second column lines belonging to the nth region, and wherein n is an integer of 2 or more.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 4A, 4B, and 4C are views illustrating a structure of an electronic device in accordance with an embodiment of the present disclosure.

DETAILED DESCRIPTION

Figure 1A:
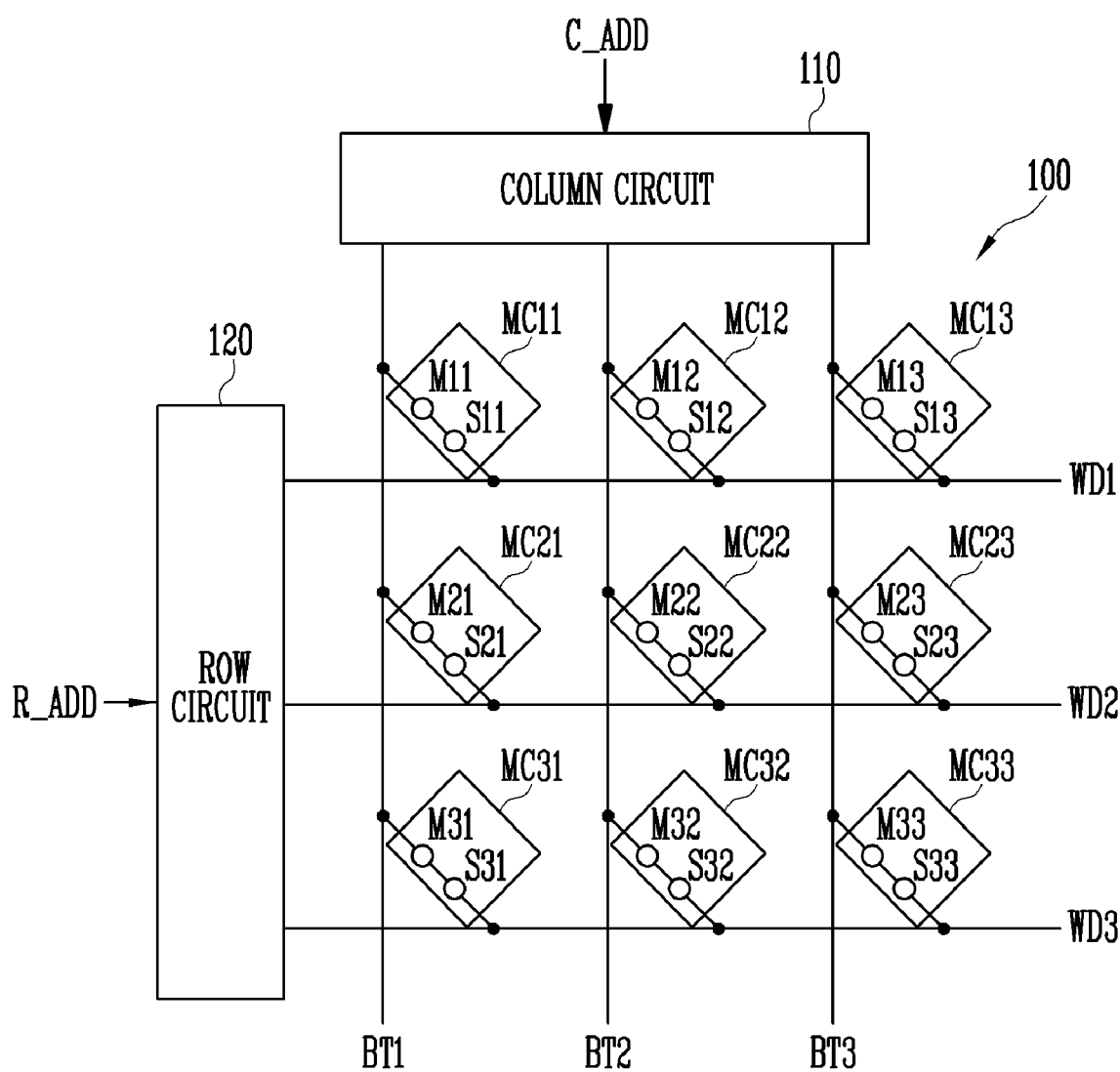
FIGS. 1A, 1B, 1C, and 1D are views illustrating a structure of an electronic device in accordance with an embodiment of the present disclosure.

Hereinafter, various embodiments will be described in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). In a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate. Throughout the disclosure, like reference numerals refer to like parts throughout the various figures and embodiments of the present disclosure.

Figure 1B:
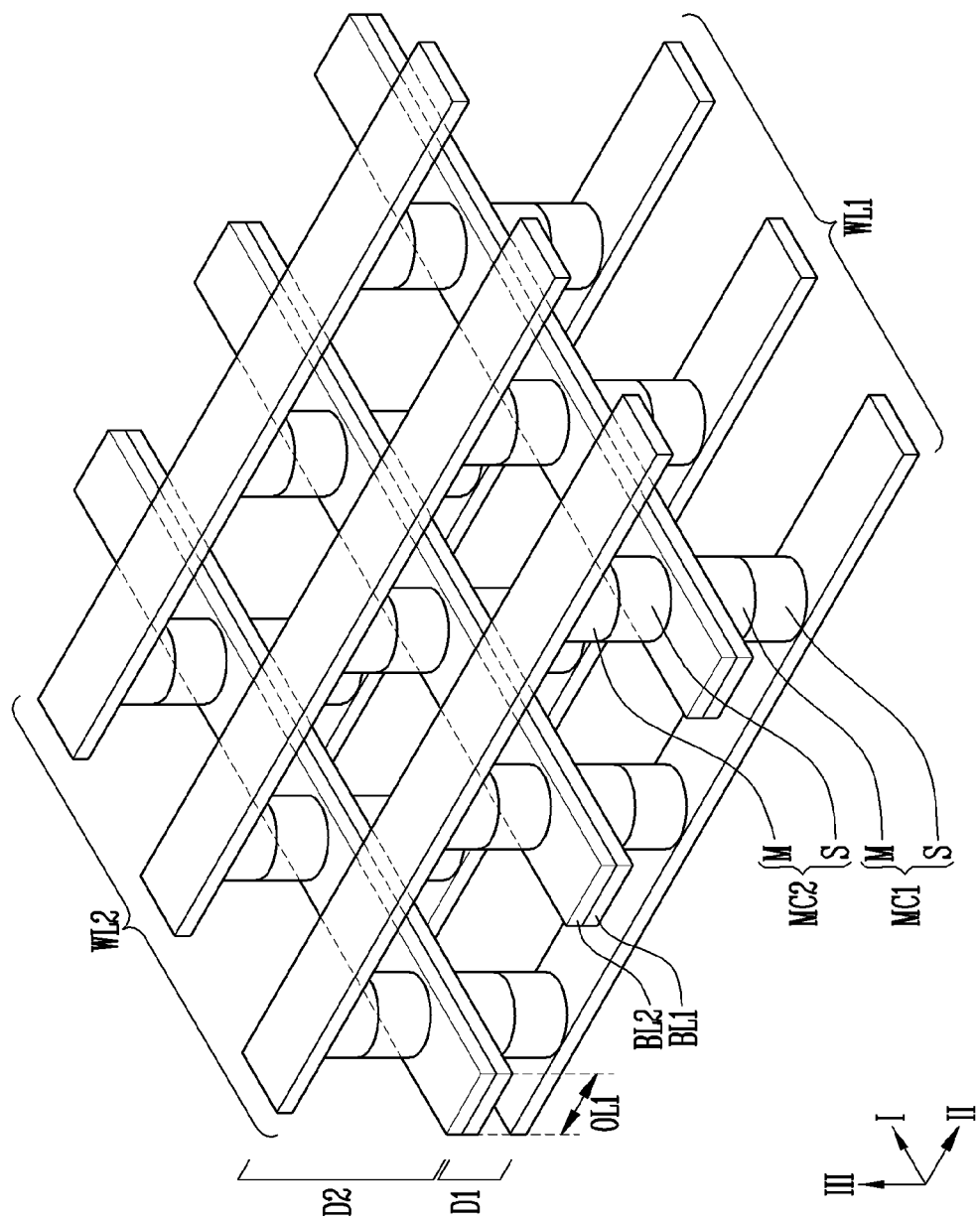
Figure 1C:
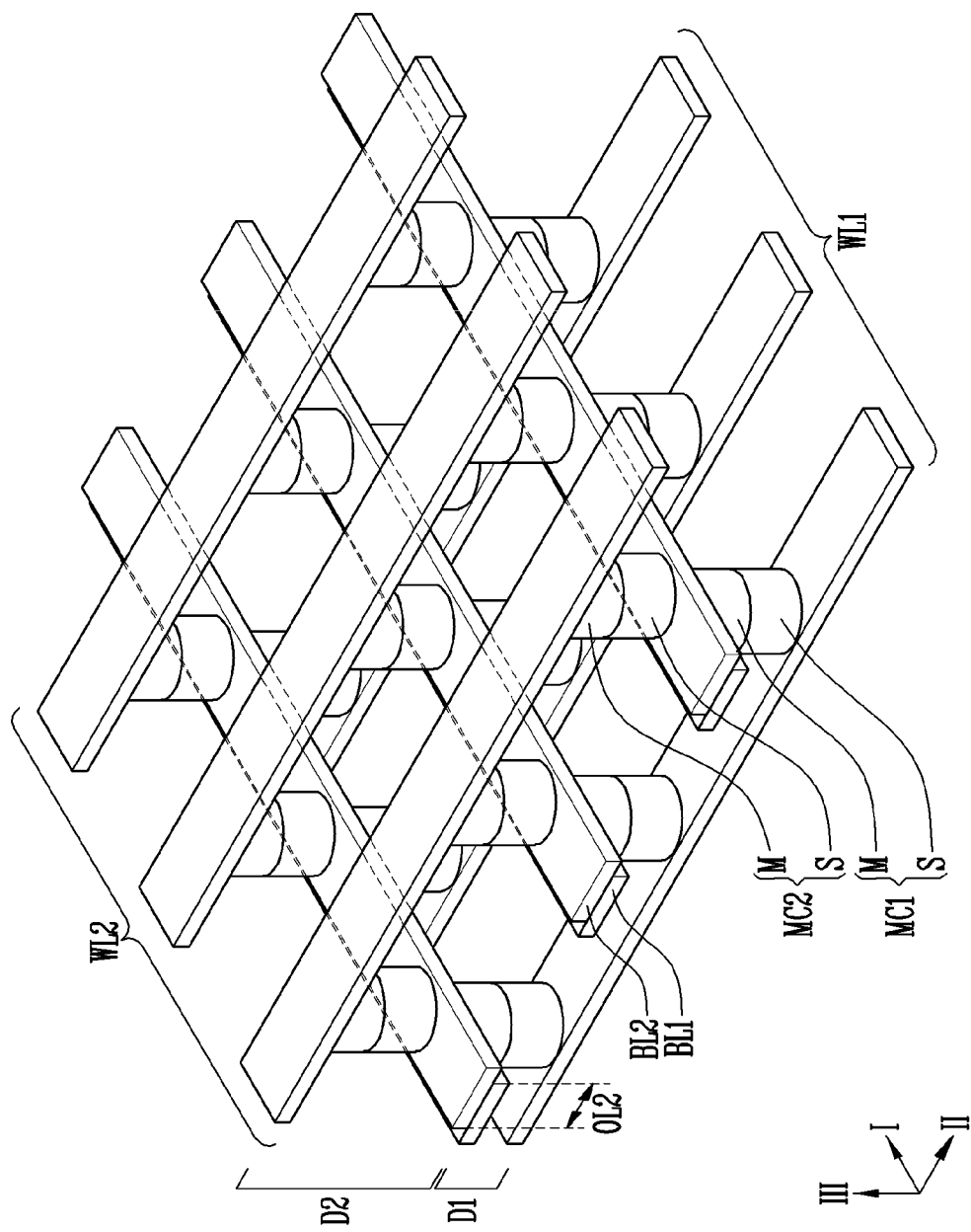
Figure 1D:
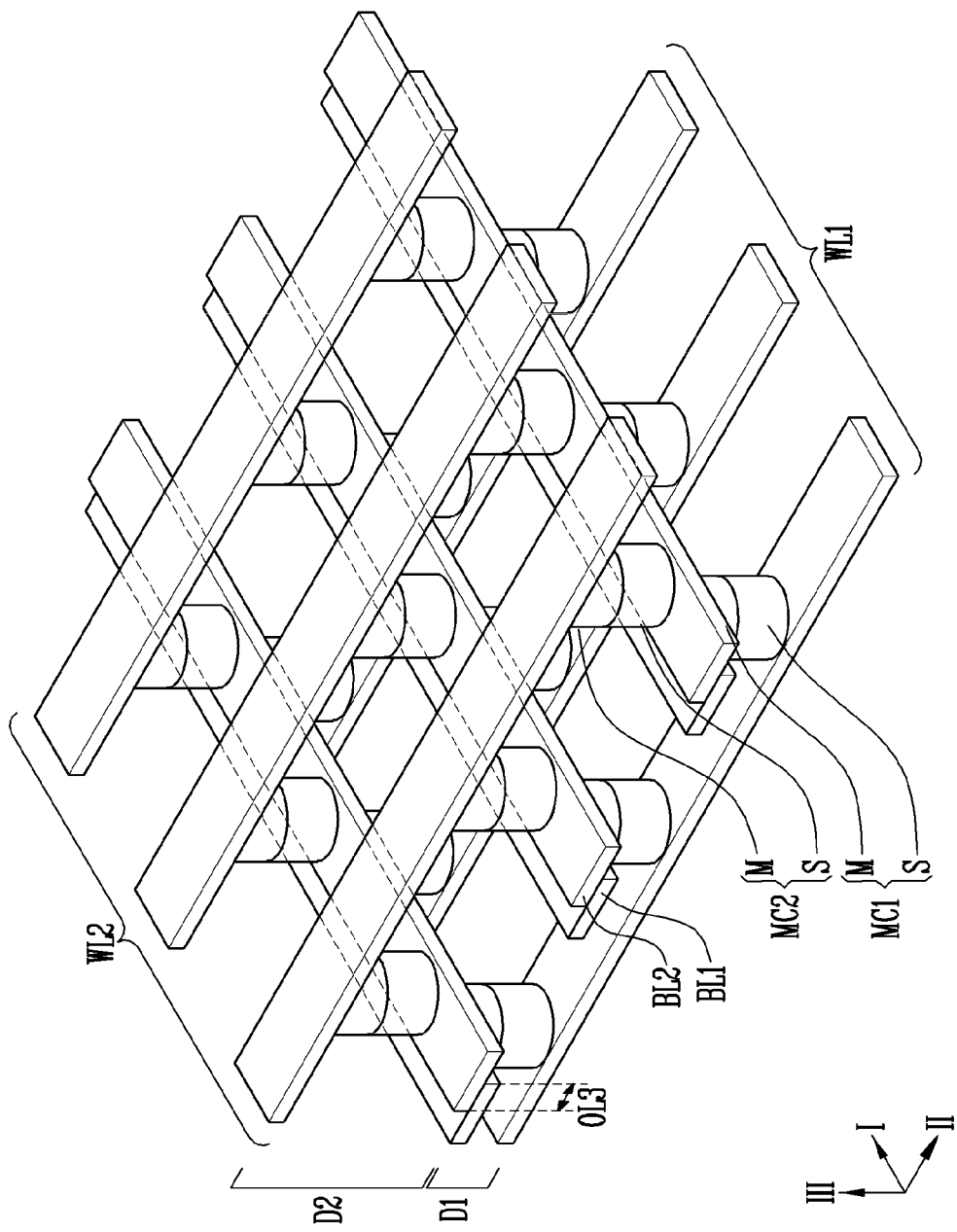

FIGS. 1A to 1D are views illustrating a structure of an electronic device in accordance with an embodiment of the present disclosure. FIG. 1A is a circuit diagram of a cell array, and FIGS. 1B to 1D are perspective views of a memory cell array.

Referring to FIG. 1A, the electronic device in accordance with the embodiment of the present disclosure may include a semiconductor memory, and the semiconductor memory may be a nonvolatile memory device or a variable resistance memory device. The semiconductor memory may include row lines and column lines intersecting the row lines. The row lines may be word lines, and the column lines may be bit lines. The word lines and the bit lines are relative concepts. The row lines may be bit lines and the column lines may be word lines. Hereinafter, a case where the row lines are word lines and the column lines are bit lines is assumed and described.

The cell array 100 may include memory cells MC11, MC12, MC13, MC21, MC22, MC23, MC31, MC32, and MC33 respectively disposed between column lines BT1, BT2, and BT3 and row lines WD1, WD2, and WD3. The memory cells MC11 to MC33 may be disposed at intersection points of the column lines BT1 to BT3 and the row lines WD1 to WD3. The memory cells MC11, MC12, MC13, MC21, MC22, MC23, MC31, MC32, and MC33 may include selection elements S11, S12, S13, S21, S22, S23, S31, S32, and S33 and memory elements M11, M12, M13, M21, M22, M23, M31, M32, and M33, which are connected in series, respectively. The selection elements S11 to S33 may be electrically connected to the row lines WD1 to WD3, and the memory elements M11 to M33 may be electrically connected to the column lines BT1 to BT3.

Each of the memory elements M11 to M33 may include an arrangement of materials capable of operating as a storage node for storing data. For example, each of the memory elements M11 to M33 may include a variable resistance material such as a resistive material, a Magnetic Tunnel Junction (MTJ), or a phase change material. Each of the selection elements S11 to S33 may be used to select a respective memory cell MC11 to MC33, and include a switching material. Each of the selection elements S11 to S33 may be a diode, a PNP diode, a BJT, a Metal Insulator Transition (MIT) element, a Mixed Ionic-Electronic Conduction (MIEC) element, an Ovonic Threshold Switching (OST) element, or the like.

The shape and configuration of each of the memory cells MC11 to MC33 may be variously modified. For example, the selection elements S11 to S33 may be omitted, or the positions of the selection elements S11 to S33 and the memory elements M11 to M33 may be reversed. That is, the selection elements S11 to S33 may be electrically connected to the column lines BT1 to BT3, and the memory elements M11 to M33 may be electrically connected to the row lines WD1 to WD3.

In addition, the semiconductor memory may further include a column circuit 110 for controlling the column lines BT1 to BT3 and a row circuit 120 for controlling the row lines WD1 to WD3.

The row circuit 120 may include a row decoder, a word line decoder, a word line driver, or the like. The row circuit 120 selects a row line WD2 among the row lines WD1 to WD2 according to a row address R_ADD. The column circuit 110 may include a column decoder, a bit line decoder, a bit line driver, or the like. The column circuit 110 selects a column line BT2 among the column lines BT1 to BT3 according to a column address C_ADD. Therefore, a memory cell MC22 connected between the selected column line BT2 and the selected row line WD2 may be selected.

Although three column lines BT1 to BT3 and three row lines WD1 to WD3 are illustrated in FIG. 1A, this is merely for convenience of description, and the present disclosure is not limited thereto. The numbers of the column lines BT1 to BT3 and the row lines WD1 to WD3, which are included in the cell array 100, may be changed, if necessary.

Referring to FIGS. 1B to 1D, the memory cell array may include column lines BL1 and BL2 and row lines WL1 and WL2, which are located at different levels. First column lines BL1 may be located above first row lines WL1, and second column lines BL2 may be located under second row lines WL2. The first row lines WL1, the first column lines BL1, the second column lines BL2, and the second row lines WL2 may be sequentially stacked. In addition, the first and second column lines BL1 and BL2 may extend in a first direction I, and the first and second row lines WL1 and WL2 may extend in a second direction II intersecting the first direction I.

Memory cells MC1 and MC2 may be disposed at intersection points of the column lines BL1 and BL2 and the row lines WL1 and WL2. First memory cells MC1 may be respectively located between the first column lines BL1 and the first row lines WL1. Second memory cells MC2 may be respectively located between the second column lines BL2 and the second row lines WL2. The second memory cells MC2 may overlap with the first memory cells in a third direction III. Each of the memory cells MC1 and MC2 may be a memory stack, and include a memory element M and a selection element S, which are stacked in the third direction III. The third direction III is a direction intersecting the first direction I and the second direction II, and may be a direction perpendicular to a plane defined by the first direction I and the second direction II.

The first column lines BL1, the first memory cells MC1, and the first row lines WL1 may constitute a first deck D1, and the second column lines BL2, the second memory cells MC2, and the second row lines WL2 may constitute a second deck D2. The first deck D1 and the second deck D2 may be stacked in the third direction III.

The first deck D1 and the second deck D2 may share the column lines BL1 and BL2. The first column lines BL1 of the first deck D1 and the second column lines BL2 of the second deck D2 overlap with each other in the third direction III, and are electrically connected to each other. For example, the first column lines BL1 and the second column lines BL2 may be conductive layers formed through a separate process, and be formed such that upper surfaces of the first column lines BL1 and lower surfaces of the second column lines BL2 are in contact with each other.

The first column lines BL1 and the second column lines BL2 extend in the first direction I while overlapping with each other, and the overlapping ratios OL1, OL2, and OL3, shown in FIGS. 1B, 1C, and 1D, respectively, may vary depending on regions. That is, the overlapping ratios OL1 to OL3 of the upper surfaces of the first column lines BL1 and the lower surfaces of the second column lines BL2 may vary depending on regions. The first column lines BL1 or the second column lines BL2 may be entirely or partially shifted in the second direction II, and the overlapping ratios OL1 to OL3 may vary depending on shift amounts. For example, the first column lines BL1 may be arranged at an equal distance, and some of the second column lines BL2 may be shifted in the second direction II. Alternatively, the first column lines BL1 may straightly extend in the first direction I, and the second column lines BL2 may be partially shifted in the second direction II. Therefore, the first memory cells MC1 and the second memory cells MC2 overlap with each other in the third direction III, and the overlapping ratio may vary depending on regions.

Although a case where the cell array has a dual-deck structure is illustrated in the drawings, the present disclosure is not limited thereto, and the cell array may further include an additional deck. The cell array may have a multi-deck structure in which row lines and column lines are alternately stacked in the third direction III. Therefore, stacked decks may share the row lines or the column lines.

According to the structure described above, memory cells MC are arranged in a cross-point array structure, and are stacked in a multi-deck structure, so that the degree of integration of a memory device can be improved. In addition, the overlapping ratio of the first column lines BL1 and the second column lines BL2 may be tuned depending on positions in a chip or mat, so that the inequality of resistance-capacitance (RC) delays depending on positions can be prevented. Thus, the electronic device can stably perform a write operation or read operation.

Figure 2A:
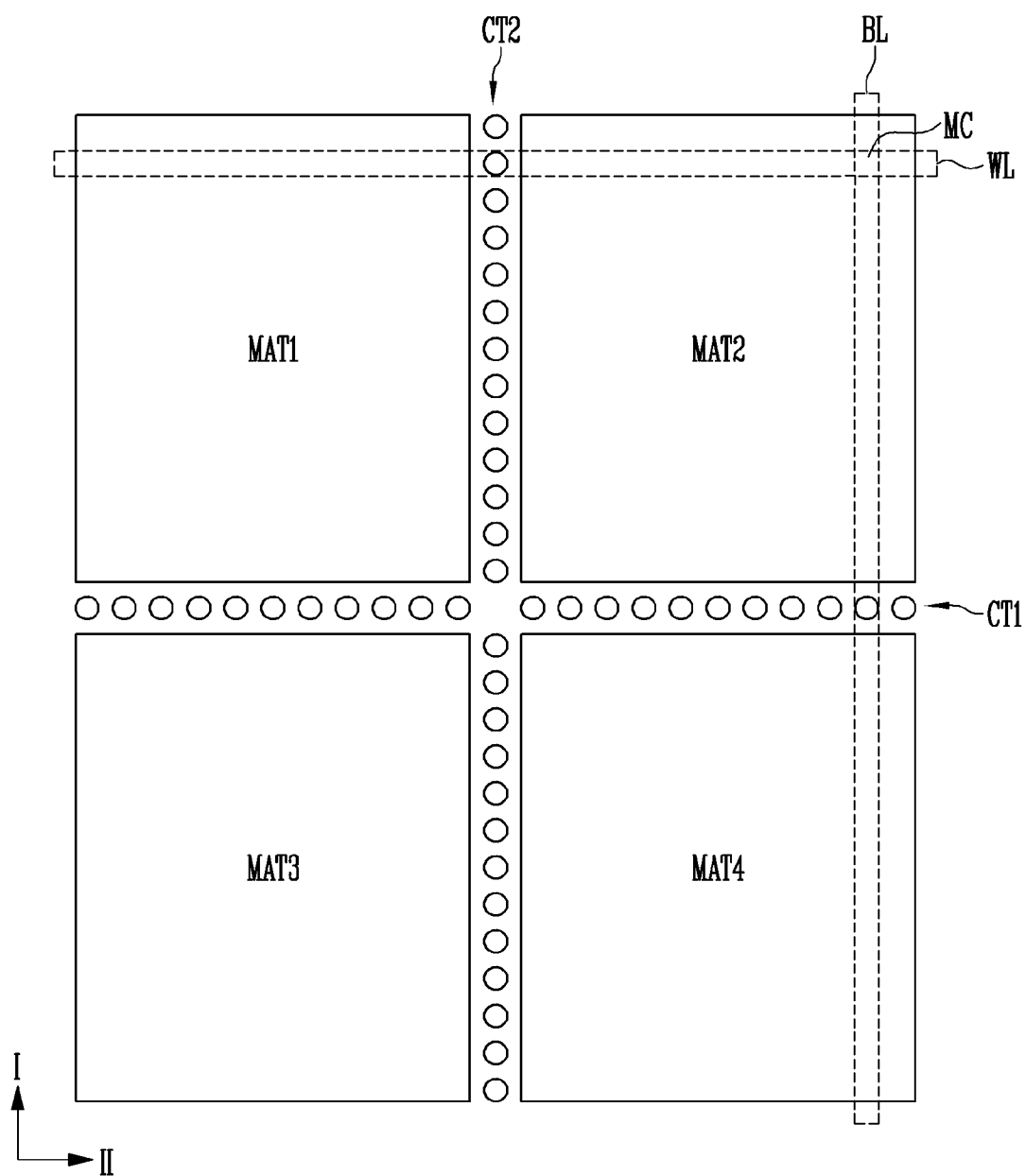
FIGS. 2A, 2B, and 2C are views illustrating a structure of an electronic device in accordance with an embodiment of the present disclosure.
Figure 2B:
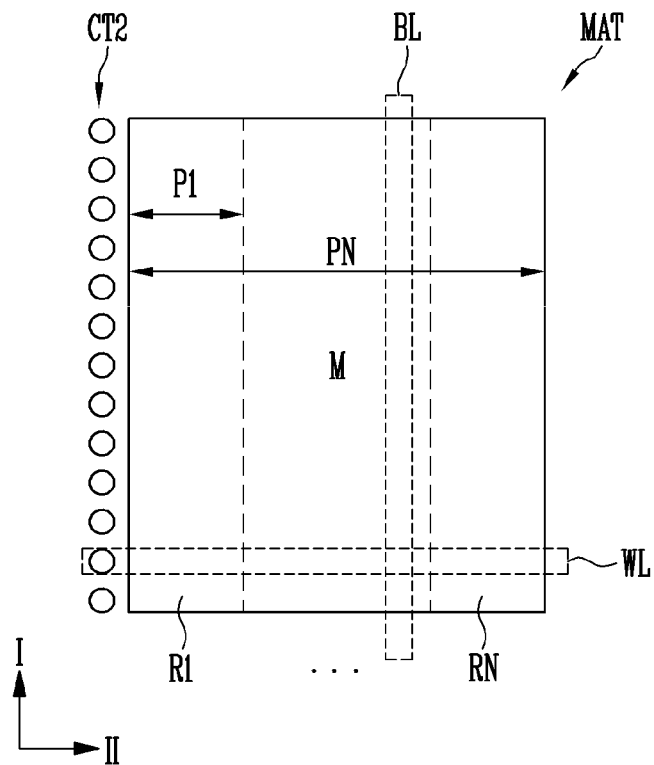
Figure 2C:
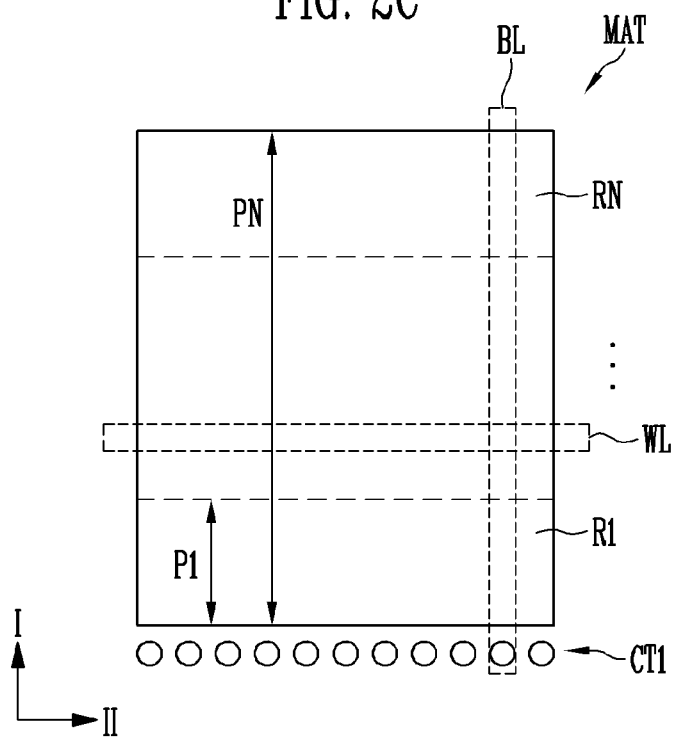

FIGS. 2A to 2C are views illustrating a structure of an electronic device in accordance with an embodiment of the present disclosure.

Referring to FIG. 2A, the electronic device in accordance with the embodiment of the present disclosure may include a plurality of mats MAT1 to MAT4. The mats MAT1 to MAT4 may be a driving unit on which a write operation or read operation is performed. For example, a write operation or read operation may be independently performed on each of the mats MAT1 to MAT4.

Contact plugs CT1 and CT2 may be located at the circumference of each of the mats MAT1 to MAT4 or between adjacent mats of the mats MAT1 to MAT4. First contact plugs CT1 may be located between a first mat MAT1 and a third mat MAT3 and between a second mat MAT2 and a fourth mat MAT4, and be arranged along a second direction II. Second contact plugs CT2 may be located between the first mat MAT1 and the second mat MAT2 and between the third mat MAT3 and the fourth mat MAT4, and be arranged along a first direction I.

The first contact plugs CT1 may be respectively connected to column lines BL, and the second contact plugs CT2 may be respectively connected to row lines WL. The first contact plugs CT1 may be used to connect the column lines BL and a column circuit. The second contact plugs CT2 may be used to connect the row lines WL and a row circuit.

Each of memory cells MC may have a current path that reaches a second contact plug CT2 via the memory cell MC from a first contact plug CT1. The current path may be a path along which a current flows in a write operation or read operation. The current path includes a path on a column line BL from the first contact plug CT1 to the memory cell MC and a path on a row line WL from the memory cell MC to the second contact plug CT2. Therefore, the memory cells MC may have different current paths depending on positions in a mat MAT.

When a write operation or read operation is performed, an RC delay varies depending on a current path. The RC delay becomes larger as the current path becomes longer, and becomes smaller as the current path becomes shorter. Hence, RC delays of the memory cells are unequal depending on positions in the mat MAT. As a result, when the write operation or read operation is performed, an over-current may flow in a memory cell MC having a short current path.

Therefore, in an embodiment of the present disclosure, regions of the mat MAT are divided according to the length of a current path. In addition, depending on regions, the overlapping ratio of the column lines BL is tuned, the overlapping ratio of the row lines WL is tuned, or the overlapping ratio of the memory cells MC is tuned in order to reduce the differences in RC delays among the current paths in the mat MAT.

FIG. 2B illustrates a method for tuning the overlapping ratio of column lines BL or the overlapping ratio of row lines WL, depending on lengths of current paths in the second direction II. Referring to FIG. 2B, the region of a mat MAT may be divided into a first region R1 to an Nth region RN along the second direction II. In other words, the region of the mat MAT may be divided into the first region R1 to the Nth region RN, based on second contact plugs CT2. Here, N may be an integer of 2 or more. The first region R1 to the Nth region RN may be sequentially arranged along the second direction II. The first region R1 may be located closest to the second contact plugs CT2, and the Nth region RN may be located most distant from the second contact plugs CT2.

A current path of a memory cell located in the first region R1 includes a current path P1 on a row line WL, and a current path of a memory cell located in the Nth region RN includes a current path PN on a row line WL. The current path P1 to PN on the row line WL increases as the location of the memory cell approaches the Nth region RN from the first region R1.

Thus, the overlapping ratio of the column lines BL may be differently tuned depending on the regions R1 to RN, or the overlapping ratio of the row lines WL may be differently tuned depending on the regions R1 to RN.

In an embodiment, when a lower deck and an upper deck share a column line BL, the overlapping ratio of the column line BL may be tuned depending on current paths in the second direction II. In other words, the overlapping ratio of the column lines BL may be tuned depending on distances of a current path on a row line WL, and in embodiments on the current path along the portion of the row line WL that spans from the point where the row line WL intersects the column line BL to the point where the row line WL intersects a second contact plug CT2. An overlapping ratio of a column line BL belonging to the region R1 in which the current path P1 to PN on the row line WL is short has a value smaller than that of an overlapping ratio of a column line BL belonging to the region RN in which the current path P1 to PN on the row line WL is long. Accordingly, the overlapping ratio of the column lines BL may decrease as approaching the first region R1 from the Nth region RN. As the overlapping ratio of the column line BL decreases, the resistance of the column line BL is increased and the RC delay of the column line BL is increased. Similarly, the shift amount of the column lines BL may be tuned such that a shift amount of the column line BL belonging to the region R1 in which the current path P1 to PN on the row line WL is short has a value greater than that of a shift amount of the column line BL belong to the region RN in which the current path P1 to PN on the row line WL is long. Accordingly, the resistance of the column line BL can be tuned depending on the regions R1 to RN, and the memory cells MC have an equal RC delay regardless of which of the regions R1 to RN the memory cells are in.

In another embodiment, when the lower deck and the upper deck share a row line WL, the overlapping ratio of the row line WL may be tuned depending on current paths in the second direction II. In other words, the overlapping ratio of the row lines WL may be tuned depending on distances of a current path on a row line WL. An overlapping ratio of a row line WL belonging to the region R1 in which the current path P1 to PN in the second direction II is short has a value smaller than that of an overlapping ratio of a row line WL belonging to the region RN in which the current path P1 to PN in the second direction II is long. Accordingly, the overlapping ratio of the row lines WL can decrease as approaching the first region R1 from the Nth region RN. As the overlapping ratio of a row line WL decreases, the resistance of the row line WL is increased and the RC delay of the row line WL is increased. Similarly, the shift amount of the row lines WL may be tuned such that a shift amount of the row line WL belonging to the region R1 in which the current path P1 to PN in the second direction II is short has a value greater than that of a shift amount of the row line WL belong to the region RN in which the current path P1 to PN in the second direction II is long. Accordingly, the resistance of the row line WL can be tuned depending on the regions R1 to RN, and the memory cells MC have an equal RC delay regardless of which of the regions R1 to RN the memory cells MC are in.

FIG. 2C illustrates a method for tuning the overlapping ratio of row lines WL or the overlapping ratio of column lines BL, depending on lengths of current paths in the first direction I. Referring to FIG. 2C, the region of a mat MAT may be divided into a first region R1 to an Nth region RN along the first direction I. In other words, the region of the mat MAT may be divided into the first region R1 to the Nth region RN, based on distances from first contact plugs CT1. Here, N may be an integer of 2 or more. The first region R1 to the Nth region RN may be sequentially arranged along the first direction I. The first region R1 may be located closest to the first contact plugs CT1, and the Nth region RN may be located most distant from the first contact plugs CT1.

A current path of a memory cell located in the first region R1 includes a current path P1 on a column line BL, and a current path of a memory cell located in the Nth region RN includes a current path PN on a column line BL. The current path P1 to PN on the column line BL increases as approaching the Nth region RN from the first region R1.

Thus, the overlapping ratio of the row lines WL may be differently tuned depending on the regions R1 to RN that the row line WL occupies, or the overlapping ratio of the column lines BL may be differently tuned depending on the regions R1 to RN.

In an embodiment, when a lower deck and an upper deck share a row line WL, the overlapping ratio of the row line WL may be tuned depending on current paths in the first direction I. In other words, the overlapping ratio of the row lines WL may be tuned depending on distances of a current path on a column line BL, and in embodiments on the current path along the portion of the column line BL that spans from the point where the column line BL intersects the row line WL to the point where the column line BL intersects the first contact plug CT1. An overlapping ratio of a row line WL belonging to the region R1 in which the current path P1 to PN on the column line BL is short has a value smaller than that of an overlapping ratio of a row line WL belonging to the region RN in which the current path P1 to PN on the column line BL is long. Accordingly, the overlapping ratio of the row lines WL can decrease as approaching the first region R1 from the Nth region RN. As the overlapping ratio of the row line WL decreases, the resistance of the row line WL is increased and the RC delay of the row line WL is increased. Similarly, the shift amount of the row lines WL may be tuned such that a shift amount of the row line WL belonging to the region R1 in which the current path P1 to PN on the column line BL is short has a value greater than that of a shift amount of the row line WL belong to the region RN in which the current path P1 to PN on the column line WL is long. Accordingly, the resistance of the row line WL can be tuned depending on the regions R1 to RN, and the memory cells MC have an equal RC delay regardless of which of the regions R1 to RN the memory cells MC are in.

In another embodiment, when the lower deck and the upper deck share a column line BL, the overlapping ratio of the column line BL may be tuned depending on current paths in the first direction I. In other words, the overlapping ratio of the column lines BL may be tuned depending on distances of a current path on a column line BL. An overlapping ratio of a column line BL belonging to the region R1 in which the current path P1 to PN in the first direction I is short has a value smaller than that of an overlapping ratio of a column line BL belonging to the region RN in which the current path P1 to PN in the first direction I is long. Accordingly, the overlapping ratio of the column lines BL can decrease as approaching the first region R1 from the Nth region RN. As the overlapping ratio of the column line BL decreases, the resistance of the column line BL is increased and the RC delay of the column line BL is increased. Similarly, the shift amount of the column lines BL may be tuned such that a shift amount of the column line BL belonging to the region R1 in which the current path P1 to PN in the first direction I is short has a value greater than that of a shift amount of the column line WL belong to the region RN in which the current path P1 to PN in the first direction I is long. Accordingly, the resistance of the column line BL can be tuned depending on the regions R1 to RN, and the memory cells MC have an equal RC delay regardless of which of the regions R1 to RN the memory cells MC are in.

Numbers of column lines BL belonging to the respective regions R1 to Rn may be equal to or different from one another, numbers of row lines WL belonging to the respective regions R1 to Rn may be equal to or different from one another, and numbers of memory cells MC belonging to the respective regions R1 to Rn may be equal to or different from one another. Overlapping ratios of column lines BL belonging to the same regions R1 to RN may be the same, overlapping ratios of row lines WL belonging to the same regions R1 to RN may be the same, and overlapping ratios of memory cells MC belonging to the same regions R1 to RN may be the same. Shift amounts of column lines BL belonging to the same regions R1 to RN may be the same, shift amounts of row lines WL belonging to the same regions R1 to RN may be the same, and shift amounts of memory cells MC belonging to the same regions R1 to RN may be the same.

Figure 3A:
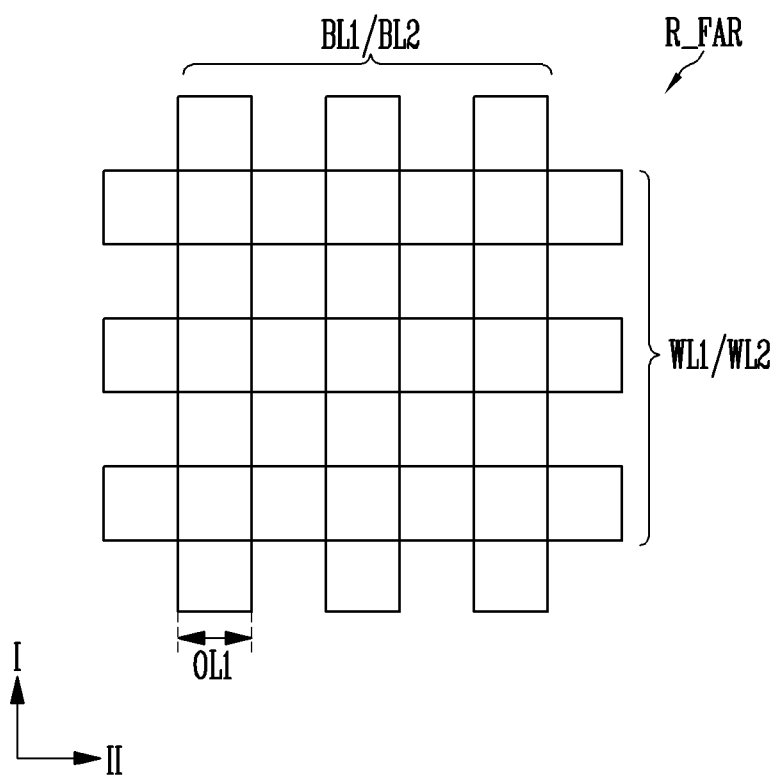
FIGS. 3A, 3B, and 3C are views illustrating a structure of an electronic device in accordance with an embodiment of the present disclosure, which illustrate differences in overlapping ratio depending on regions.
Figure 3B:
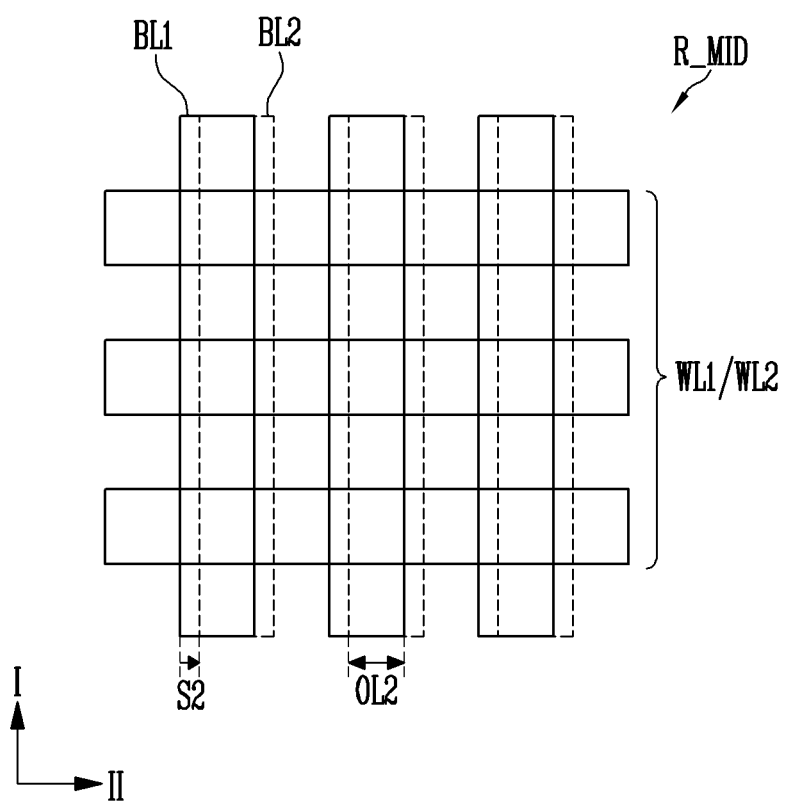
Figure 3C:
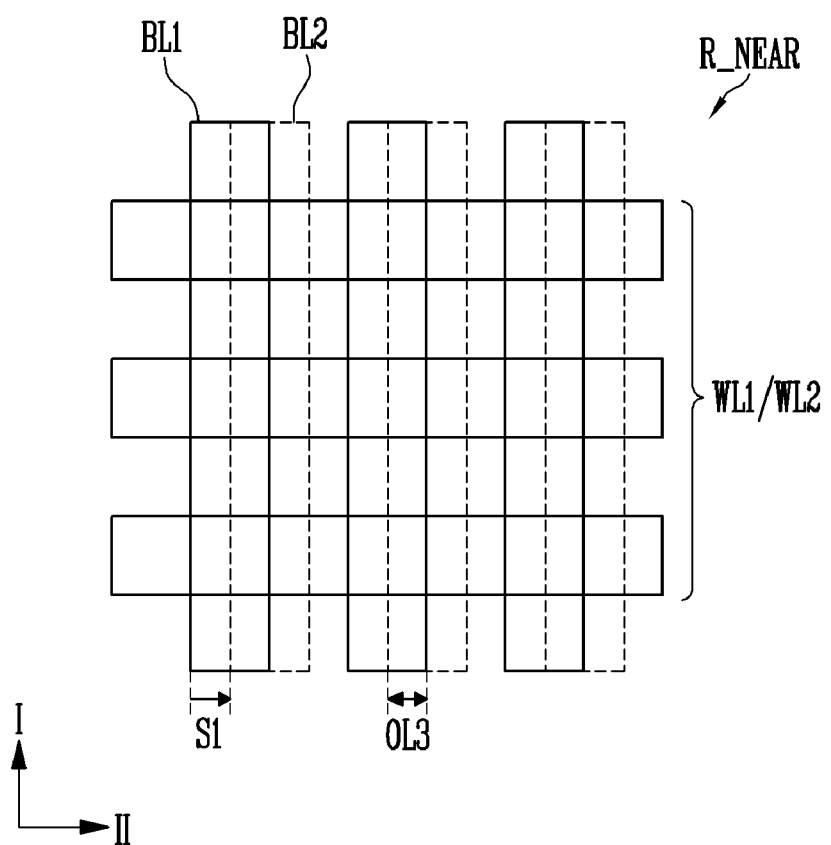

FIGS. 3A to 3C are views illustrating a structure of an electronic device in accordance with an embodiment of the present disclosure, which illustrate differences in overlapping ratio depending on regions. FIG. 3A illustrates a FAR region R_FAR in which a current path is relatively long among regions R1 to RN, FIG. 3C illustrates a NEAR region R_NEAR in which a current path is relatively short among the regions R1 to RN, and FIG. 3B illustrates a MID region R_MID in which a current path is longer than the NEAR region R_NEAR and shorter than the FAR region R_FAR. The current path of the MID region R_MID may be an average length among the regions R1 to RN.

Referring to FIG. 3A, an overlapping ratio OL1 of first and second column lines BL1 and BL2 is highest in the FAR region R_FAR in which the current path is long. That is, the shift amount of the second column line BL2 is smallest, relative to the first column line BL1. For example, the first column line BL1 and the second column line BL2 may completely overlap with each other. As a result, in FIG. 3A the second column lines BL2 are hidden under the first column lines BL1 and the second row lines WL2 are hidden under the first row lines WL1.

Referring to FIGS. 3B and 3C, the overlapping ratio of a region becomes lower as the region has a shorter current path (OL3<OL2<OL1). An overlapping ratio OL2 of the MID region R_MID has a value smaller than that of the overlapping ratio OL1 of the FAR region R_FAR. For example, the second column lines BL2 are shifted in the second direction II from the first column lines BL1. In FIGS. 3B and 3C, the second column lines BL2 (drawn with dashed lines) are partially hidden under the first column lines BL1 and the second row lines WL2 are hidden under the first row lines WL1.

An overlapping ratio OL3 of the NEAR region R_NEAR has a value smaller than that of the overlapping ratio OL2 of the MID region R_MID. For example, the second column lines BL2 are shifted in the second direction II from the first column lines BL1. In addition, a shift amount S1 of the NEAR region R_NEAR may have a value greater than that of a shift amount S2 of the MID region R_MID.

Figure 4C:
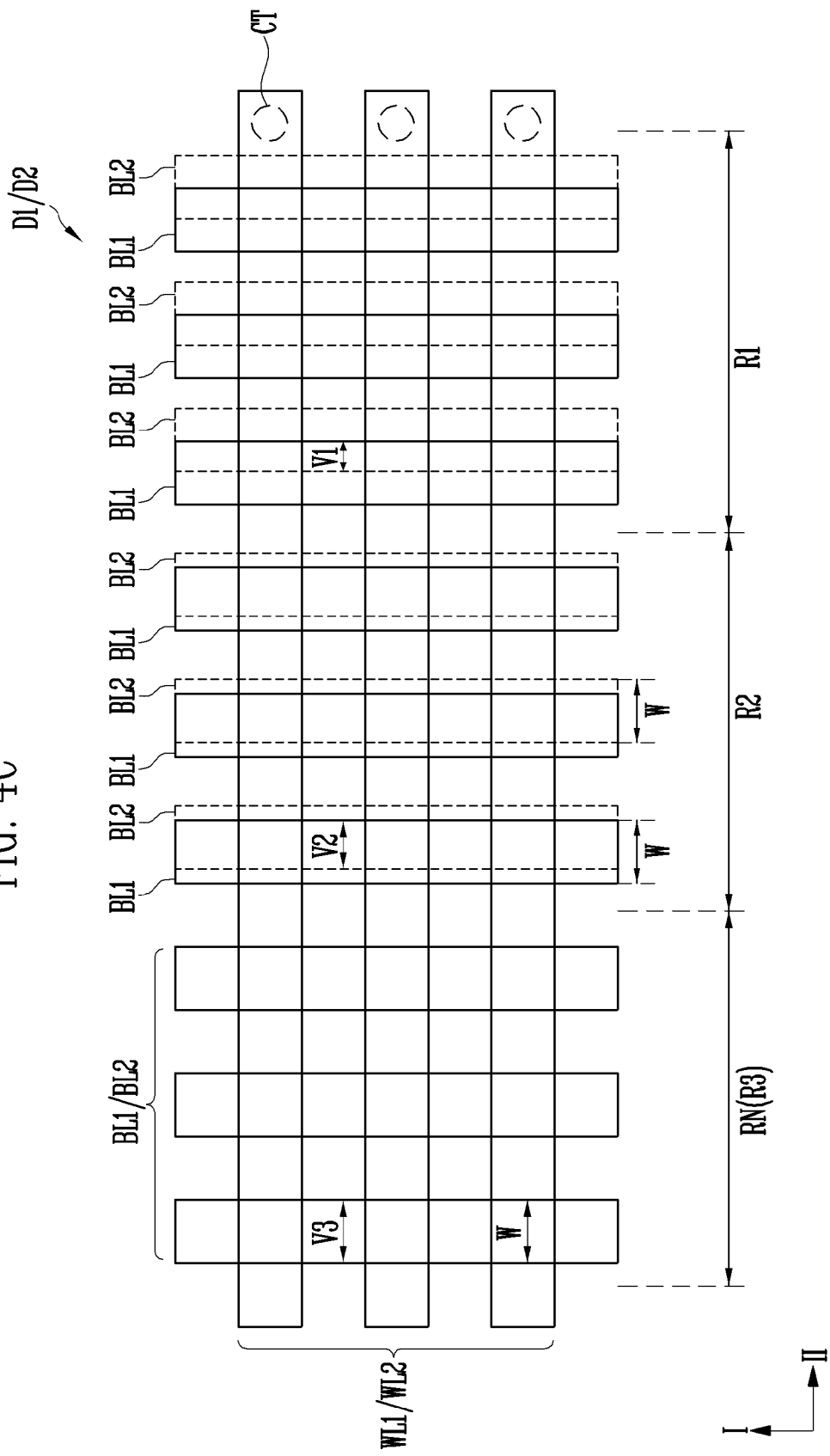

FIGS. 4A to 4C are views illustrating a structure of an electronic device in accordance with an embodiment of the present disclosure.

FIG. 4A illustrates a structure of a first deck D1, FIG. 4B illustrates a structure of a second deck D2, and FIG. 4C illustrates the structure of the first deck D1 and the structure of the second deck D2 combined. Each of the first deck D1 and the second deck D2 includes first to Nth regions R1 to RN sequentially defined along the second direction II. The first region R1 may be a region in which a current path is shortest, and the Nth region RN may be a region in which a current path is longest. The current path may become longer as approaching the Nth region RN from the first region R1. Hereinafter, a case where N is 3 is assumed and described.

Referring to FIG. 4A, the first deck D1 includes first column lines BL1, first row lines WL1, and memory cells MC1. The first column lines BL1 extend in parallel in the first direction I. The first column lines BL1 may be arranged at an equal distance L1 in the first to third regions R1 to R3, and be arranged at the equal distance even between adjacent regions R1/R2 and R2/R3.

The first row lines WL1 may extend in parallel in the second direction II. The first memory cells MC1 may be arranged in the first direction I and the second direction II, and be arranged in a matrix form. Adjacent first memory cells MC1 may be arranged such that their center axes correspond to each other in the first direction I or the second direction II.

Referring to FIG. 4B, the second deck D2 includes second column lines BL2, second row lines WL2, and second memory cells M2. The second column lines BL2 extend in parallel in the first direction I. The second column lines BL2 are arranged at predetermined distances L2, L2_1, and L2_2 along the second direction II.

The second column lines BL2 may have an equal distance in the first to third regions R1 to R3. The distance between adjacent second column lines BL2 in each of the first to third regions R1 to R3 may be L2. The distance L2 between the second column lines BL2 may be substantially equal to (L1=L2) or different from (L1≠L2) the distance L1 between the first column lines BL1.

The second column lines BL2 may be arranged at different distances at boundaries of adjacent regions R1/R2 and R2/R3. The second column lines BL2 may be arranged at a distance of L2_1 at the boundary between the first region R1 and the second region R2, and L2_1 may have value greater than that of L2. The second column lines BL2 may be arranged at a distance of L2_2 at the boundary between the second region R2 and the third region R3, and L2_2 may have a value greater than L2_1. The distance between the second column lines BL2 may increase at the boundaries between the regions as approaching the first region R1 to the Nth region RN.

The second column lines BL2 may be shifted from corresponding first column lines BL1, and be shifted in the second direction II. The shift amount of the second column lines BL2 may vary depending on the regions R1 to RN. The shift amount may increase as approaching the first region R1 from the Nth region. For example, a shift amount S1 of the first region R1 may be greater than that S2 of the second region R2. In FIG. 4B, the second column lines BL2 that have been shifted are drawn using dashed lines.

Referring to FIG. 4C, the first column lines BL1 and the second column lines BL2 extend in the first direction I while at least partially overlapping with each other. The overlapping ratio of the first column lines BL1 and the second column lines BL2 may vary in the first to third regions R1 to R3. The overlapping ratio may decrease as approaching the first region R1 from the Nth region RN. Note that in FIG. 4C, the second row lines WL2 and the unshifted second column lines BL2 in the third region RN (R3) are hidden under the corresponding first row lines WL1 and first column lines BL1.

When assuming that the first column lines BL1 and the second column lines BL2 substantially have the same line width W, overlapping ratios of the respective regions R1 to R3 may be calculated as ratios of overlapping width V1 to V3 of the first column lines BL1 and the second column lines BL2 with respect to the line width W. The overlapping ratio of the first region R1 may be V1/W, the overlapping ratio of the second region R2 may be V2/W, and the overlapping ratio of the third region R3 may be V3/W. Thus, the resistance of the column lines BL1 and BL2 is increased by decreasing the overlapping ratio in a region having a short current path, so that the RC delay of the column lines BL1 and BL2 can be increased. Accordingly, the regions R1 to RN having different current paths have an equal RC delay.

In addition, the second memory cells MC are shifted when the second column lines BL2 are shifted. The overlapping ratio of the second memory cells MC2 with the first memory cells MC decreases as the shift amount of the second memory cells MC2 increases. Therefore, the overlapping ratio of the first memory cells MC1 and the second memory cells MC2 may vary depending on the regions R1 to RN. The overlapping ratio of the first memory cells MC1 and the second memory cells MC2 may decrease as approaching the first region R1 from the Nth region RN.

Figure 5A:
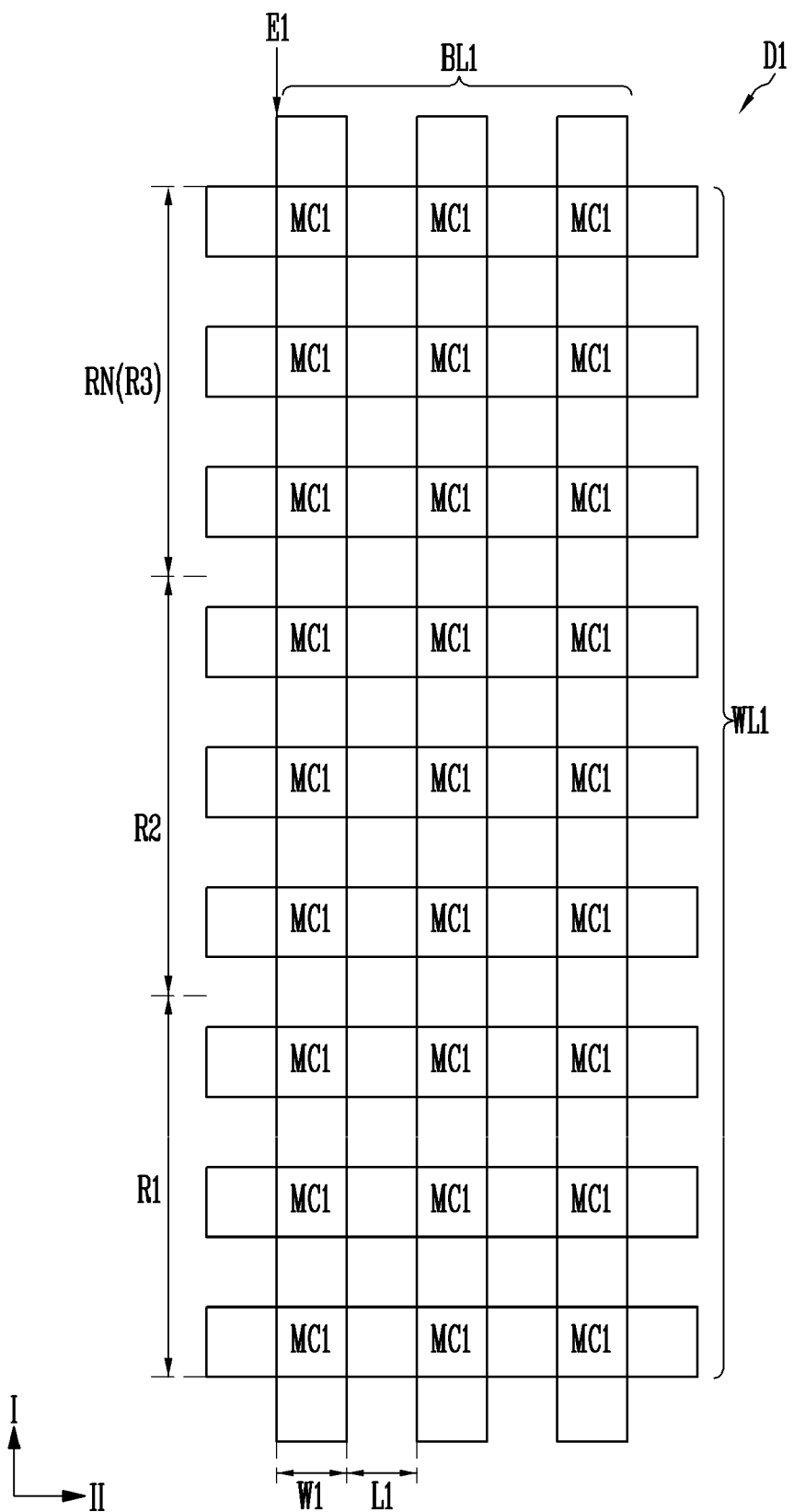
FIGS. 5A, 5B, and 5C are views illustrating a structure of an electronic device in accordance with an embodiment of the present disclosure.
Figure 5B:
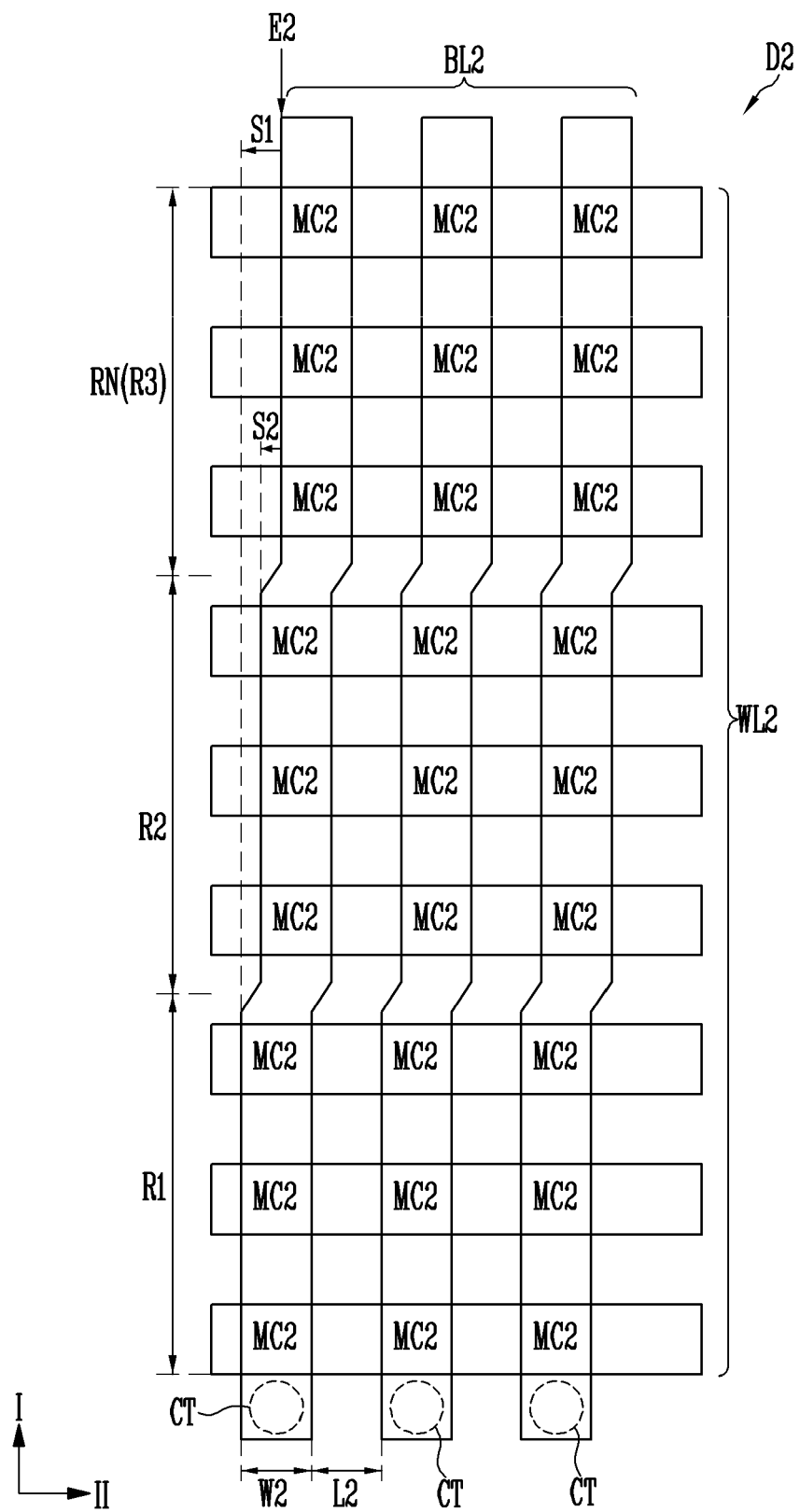
Figure 5C:
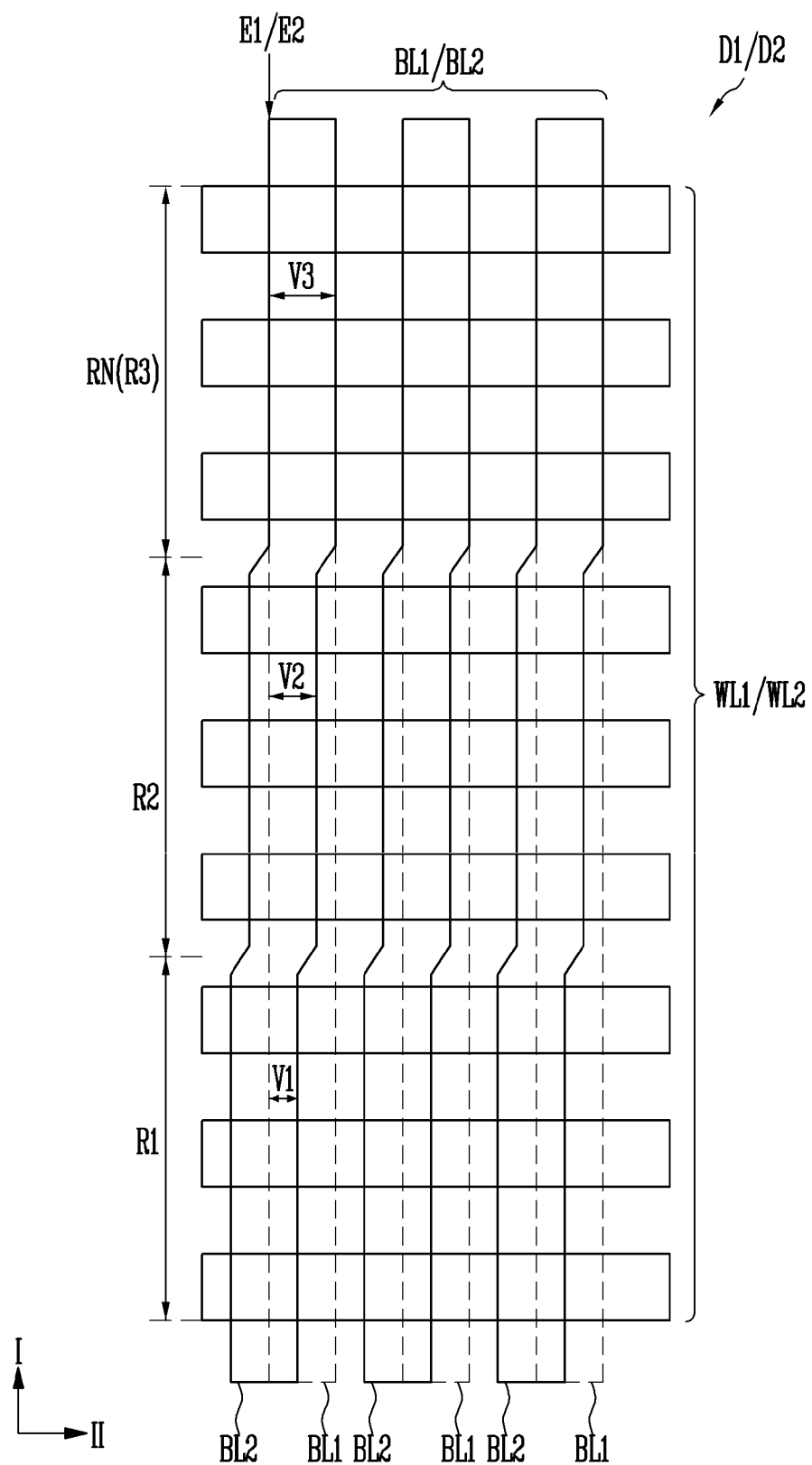

FIGS. 5A to 5C are views illustrating a structure of an electronic device in accordance with an embodiment of the present disclosure.

FIG. 5A illustrates a structure of a first deck D1, FIG. 5B illustrates a structure of a second deck D2, and FIG. 5C illustrates the structure of the first deck D1 and the structure of the second deck D2 combined. Each of the first deck D1 and the second deck D2 includes first to Nth regions R1 to RN sequentially defined along the first direction I. The first region R1 may be a region in which a current path is shortest, and the Nth region RN may be a region in which a current path is longest. The current path may become longer as approaching the Nth region RN from the first region R1. Hereinafter, a case where N is 3 is assumed and described.

Referring to FIG. 5A, the first deck D1 includes first column lines BL1, first row lines WL1, and first memory cells MC1. The first column lines BL1 may extend in parallel in the first direction I, and straightly extend without bending from the first region R1 to the third region R3. Each of the first column lines BL1 may have an edge E1 extending in the first direction I and a width W1 in the second direction II. The distance between adjacent first column lines BL1 may be L1.

The first column lines BL1 may have an equal width W1 in the first to third regions R1 to R3. Also, the first column lines BL1 may have an equal distance L1 in the first to third regions R1 to R3.

The first row lines WL1 may extend in parallel in the second direction II. The first memory cells MC may be arranged in the first direction I and the second direction II, and be arranged in a matrix form. Adjacent first memory cells MC1 may be arranged such that their center axes correspond to each other in the first direction I or the second direction II.

Referring to FIG. 5B, the second deck D2 includes second columns BL2, second row lines WL2, and second memory cells MC2. The second column lines BL2 extend in parallel in the first direction I. Each of the second columns BL2 may have an edge E2 extending in the first direction I and a width W2 in the second direction II. The second column lines BL2 may substantially have the same width as the first column lines BL1 (W1=W2) or different widths than the first column lines BL1 (W1≠W2).

The distance between adjacent second column lines BL2 may be L2. The distance L2 between the second column lines BL2 may be substantially equal to (L1=L2) or different from (L1≠L2) the distance L1 between the first column lines BL1.

The second column lines BL2 may have an equal width W2 in the first to third regions R1 to R3. Also, the second column lines BL2 may have an equal distance L2 in the first to third regions R1 to R3.

Each of the second column lines BL2 may be partially bent. Each of the second column lines BL2 may be bent at boundaries between the regions R1 to RN. For example, the second column lines BL2 are bent at the boundary between the first region R1 and the second region R2 and also at the boundary between the second region R2 and the third region R3. In addition, the second column lines BL2 may straightly extend in the first direction I in the first region R1, in the second region R2, and in the third region R3.

Each of the second column lines BL2 may be in part shifted, and have portions shifted in the second direction II. The shift amount of the second column lines BL2 may vary depending on the regions R1 to RN. The shift amount may increase as approaching the first region R1 from the Nth region RN. For example, a first shift amount S1 of the portion of the second column lines BL2 in the first region R1 may be greater than a second shift amount S2 of the portion of the second column lines BL2 in the second region R2.

Referring to FIG. 5C, the first column lines BL1 and the second column lines BL2 (drawn with dashed lines, and hidden in the first region R1) extend in the first direction I while at least partially overlapping with each other. The overlapping ratio of the first column lines BL1 and the second column lines BL2 may vary between the first to third regions R1 to R3. The overlapping ratio may decrease as approaching the first region R1 from the Nth region RN.

When assuming that the first column lines BL1 and the second column lines BL2 substantially have the same line width W, overlapping ratios of the respective regions R1 to R3 may be calculated as ratios of overlapping width V1 to V3 of the first column lines BL1 and the second column lines BL2 with respect to the line width W. The overlapping ratio of the first region R1 may be V1/W, the overlapping ratio of the second region R2 may be V2/W, and the overlapping ratio of the third region R3 may be V3/W. Thus, the resistance of the column lines BL1 and BL2 is increased by decreasing the overlapping ratio in a region having a short current path, so that the RC delay of the column lines BL1 and BL2 can be increased. Accordingly, the regions R1 to RN having different current paths have a more equal RC delay.

In addition, the second memory cells MC are shifted when the second column lines BL2 are shifted. The overlapping ratio of the second memory cells MC2 with the first memory cells MC decreases as the shift amount of the second memory cells MC2 increases. Therefore, the overlapping ratio of the first memory cells MC1 and the second memory cells MC2 may vary depending on the regions R1 to RN. The overlapping ratio of the first memory cells MC1 and the second memory cells MC2 may decrease as approaching the first region R1 from the Nth region RN.

Figure 6A:
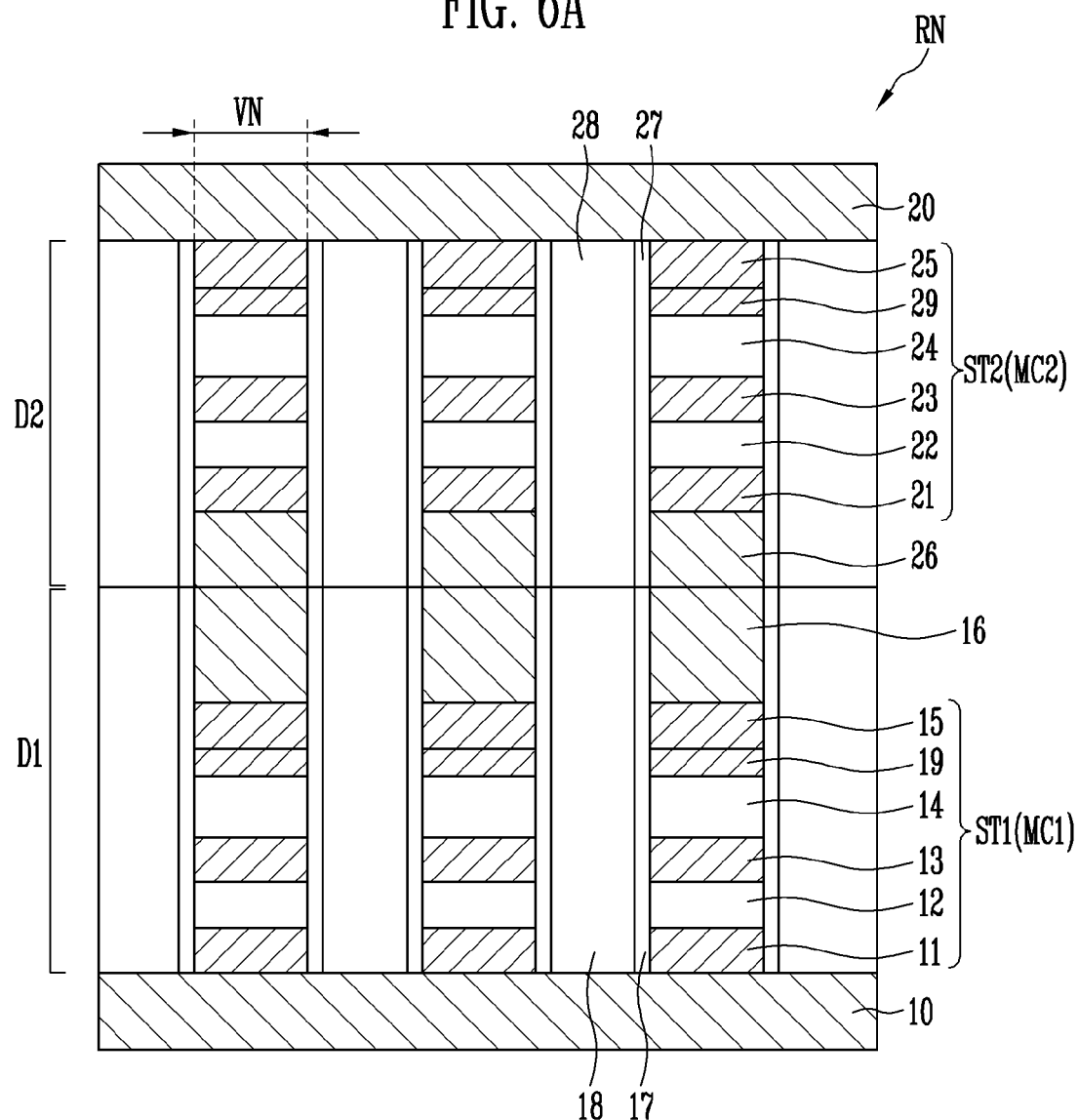
FIGS. 6A, 6B, and 6C are sectional views illustrating a structure of an electronic device in accordance with an embodiment of the present disclosure.
Figure 6B:
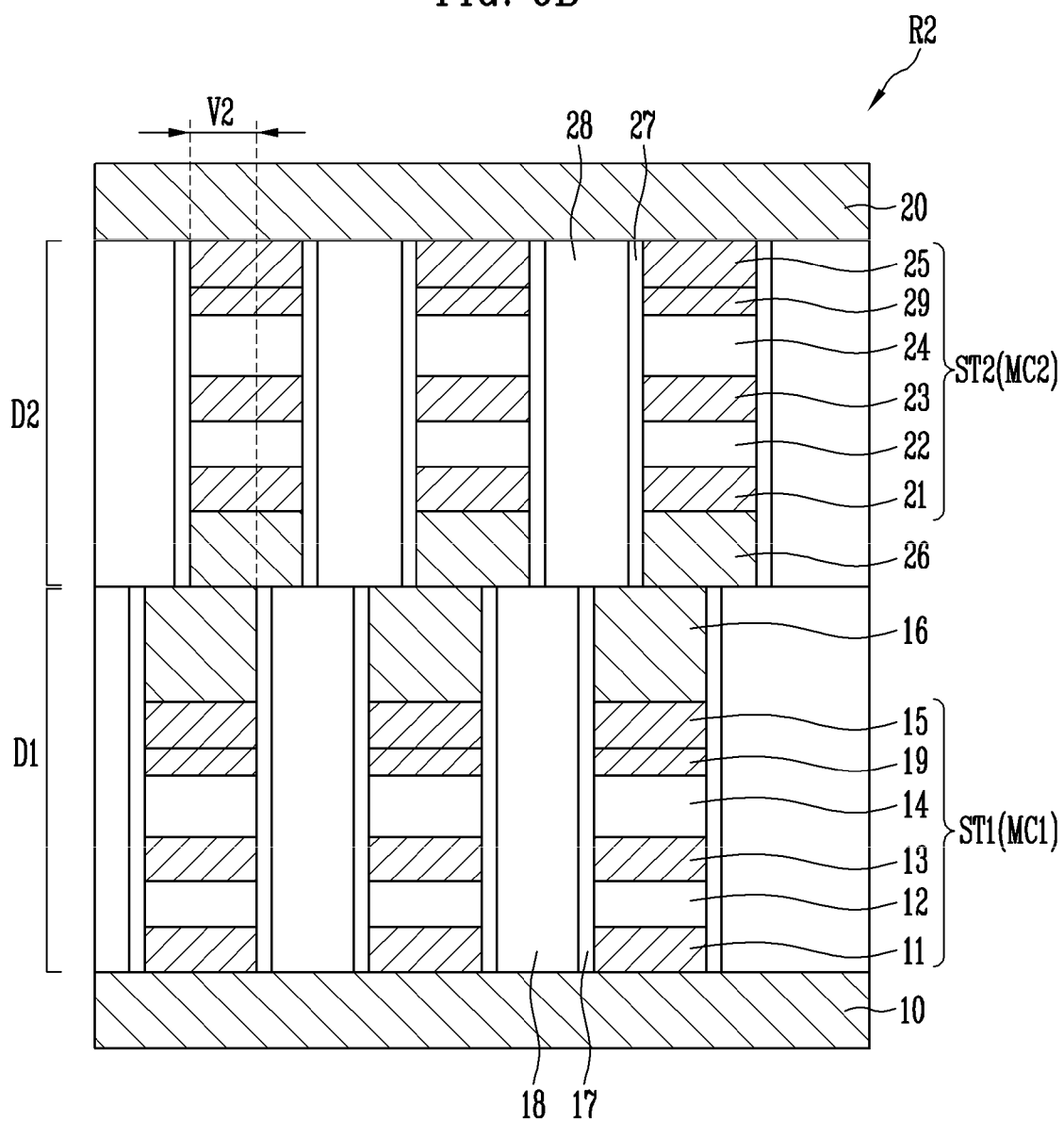
Figure 6C:
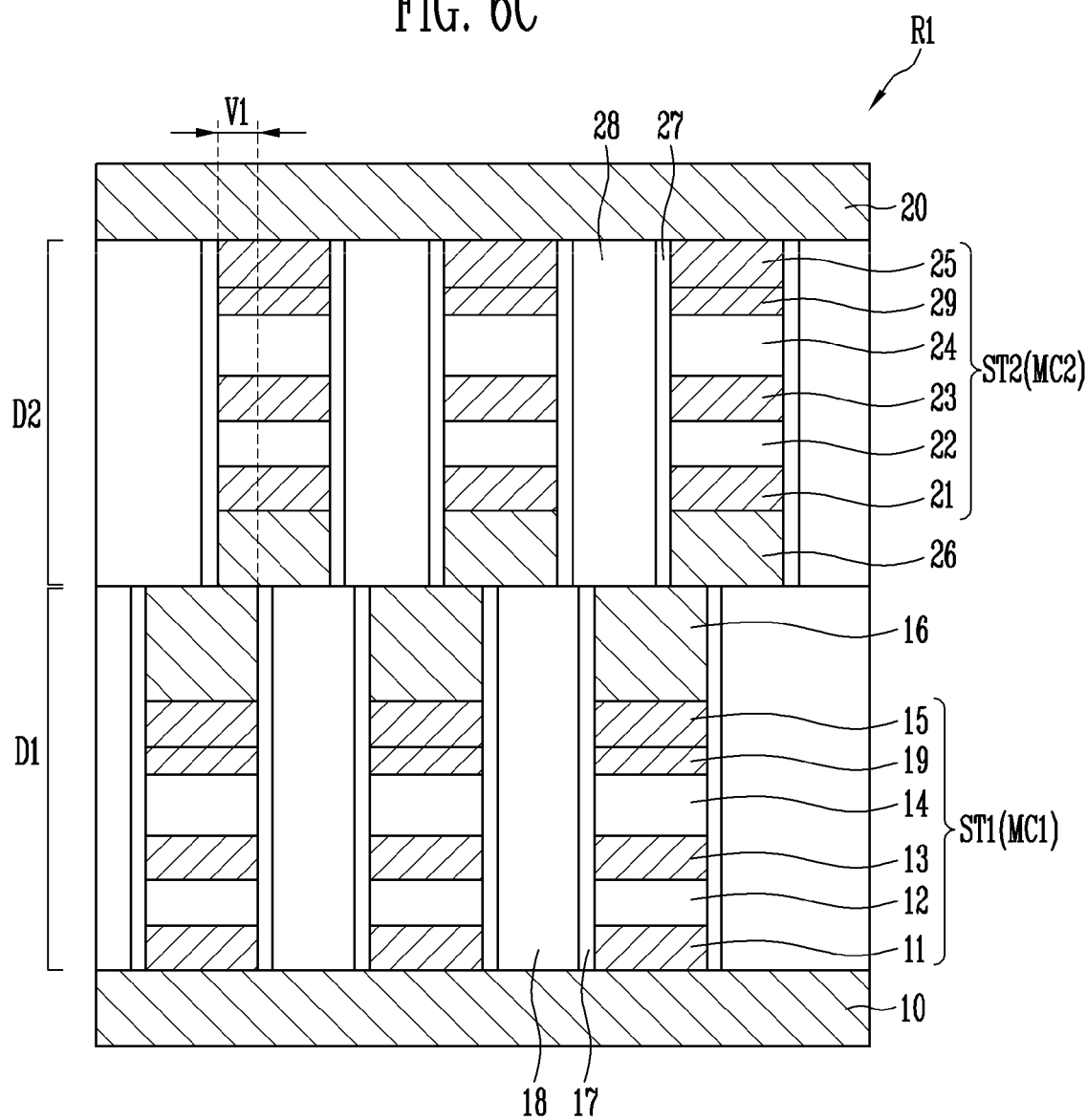

FIGS. 6A to 6C are sectional views illustrating a structure of an electronic device in accordance with an embodiment of the present disclosure.

Referring to FIGS. 6A to 6C, the electronic device in accordance with the embodiment of the present disclosure has a multi-deck structure, and may include a first deck D1 and a second deck D2.

The first deck D1 may include first row lines 10, first column lines 16, first memory cells MC1, first protective layers 17, and a first insulating layer 18. The first memory cells MC1 may be respectively located between the first row lines 10 and the first column lines 16. The first row lines 10 and the first column lines 16 may include tungsten (W), tungsten silicon nitride (WSiN), titanium (Ti), titanium nitride (TiN), copper (Cu), or the like, or include any combination thereof.

The second deck D2 may include second row lines 20, second column lines 26, second memory cells MC2, second protective layers 27, and a second insulating layer 28. The second memory cells MC2 may be respectively located between the second row lines 20 and the second column lines 26. The second row lines 20 and the second column lines 26 may include tungsten (W), tungsten silicon nitride (WSiN), titanium (Ti), titanium nitride (TiN), copper (Cu), or the like, or include any combination thereof.

The first row lines 10 and the first column lines 16 may extend while intersecting each other, and be orthogonal to each other. The second row lines 10 and the second column lines 26 may extend while intersecting each other, and be orthogonal to each other. The first row lines 10 and the second row lines 20 may be located at different levels, and extend in parallel. The first column lines 16 and the second column lines 26 may be located at different levels, and extend in parallel.

The first row lines 10, the first column lines 16, the second column lines 26, and the second row lines 20 may be sequentially stacked. The first column lines 16 and the second column lines 26 may be in contact with each other, and be electrically connected to each other. For example, upper surfaces of the first column lines 16 and lower surfaces of the second column lines 26 may be in direct contact with each other. In addition, the overlapping width V1 to VN or overlapping ratio of the first column lines 16 and the second column lines 26 may vary depending on regions R1 to RN. That is, the contact area of the upper surfaces of the first column lines 16 and the lower surfaces of the second column lines 26 may vary depending on the regions R1 to RN.

Referring to FIG. 6A, in an Nth region RN in which a current path is longest, the overlapping width VN or overlapping ratio of the first column lines 16 and the second column lines 26 is greatest. The shift amount of the second column lines 26 may be smallest, and the shift amount of the second memory cells MC2 may be smallest. Therefore, the overlapping ratio of the first memory cells MC1 and the second memory cells MC2 may be greatest. For example, the overlapping ratio may be about 100%.

Referring to FIG. 6B, a second region R2 has a current path shorter than that of the Nth region RN. Therefore, the overlapping width V2 or overlapping ratio of the first column lines 16 and the second column lines 26 is decreased as compared with the Nth region RN. As compared with the Nth region RN, the shift amount of the second column lines 26 is increased, and the shift amount of the second memory cells MC2 is increased. Therefore, as compared with the Nth region RN, the overlapping ratio of the first memory cells MC1 and the second memory cells MC2 decreases. For example, the overlapping ratio may be about 80%.

Referring to FIG. 6C, in a first region R1 in which a current path is shortest, the overlapping width V1 or overlapping ratio of the first column lines 16 and the second column lines 26 is smallest. The shift amount of the second column lines 26 may be greatest, and the shift amount of the second memory cells MC2 may be greatest. Therefore, the overlapping ratio of the first memory cells MC1 and the second memory cells MC2 may be smallest. For example, the overlapping ratio may be about 60%.

Referring back to FIGS. 6A to 6C, each of the first memory cells MC1 may include a first lower electrode 11, a first switching layer 12, a first intermediate electrode 13, a first variable resistance layer 14, and a first upper electrode 15, which are sequentially stacked. In addition, each of the second memory cells MC2 may include a second lower electrode 21, a second switching layer 22, a second intermediate electrode 23, a second variable resistance layer 24, and a second upper electrode 25, which are sequentially stacked.

The first and second variable resistance layers 14 and 24 may have a characteristic they are reversibly switched between different resistance states according to an applied voltage or current. Therefore, when the first and second variable resistance layers 14 and 24 have a low resistance state, data '1' may be stored. When the first and second variable resistance layers 14 and 24 have a high resistance state, data '0' may be stored.

When the first and second variable resistance layers 14 and 24 are made of a resistive material, the first and second variable resistance layers 14 and 24 may include a transition metal oxide or include a metal oxide such as a perovskite-based material. Therefore, an electrical path may be generated or eliminated in the first and second variable resistance layers 14 and 24, thereby storing data.

When the first and second variable resistance layers 14 and 24 have a Magnetic Tunnel Junction (MTJ) structure, the first and second variable resistance layers 14 and 24 may include a magnetization fixed layer, a magnetization free layer, and a tunnel barrier layer interposed between the magnetization fixed layer and the magnetization free layer. For example, the magnetization fixed layer and the magnetization free layer may include a magnetic material, and the tunnel barrier layer may include an oxide such as an oxide of magnesium (Mg), an oxide of aluminum (Al), an oxide of zinc (Zn), or an oxide of titanium (Ti). The magnetization direction of the magnetization free layer may be changed by the spin torque of electrodes in an applied current. Therefore, data may be stored based on a change in the magnetization direction of the magnetization free layer with respect to the magnetization direction of the magnetization fixed layer.

When the first and second variable resistance layers 14 and 24 are made of a phase change material, the first and second variable resistance layers 14 and 24 may include a chalcogenide-based material. The first and second variable resistance layers 14 and 24 may include, as the chalcogenide-based material, silicon (Si), germanium (Ge), antimony (Sb), tellurium (Te), bismuth (Bi), indium (In), tin (Sn), selenium (Se) or the like, or include any combination thereof. For example, the first and second variable resistance layers 14 and 24 may be Ge—Sb—Te (GST), and be $Ge_2Sb_2Te_5$, $Ge_2Sb_2Te_7$, $Ge_1Sb_2Te_4$, $Ge_1Sb_4Te_7$ or the like. The chemical composition ratio of the first and second variable resistance layers 14 and 24 may be determined by considering properties such as a melting point and a crystallization temperature. Also, the first and second variable resistance layers 14 and 24 may further include an impurity such as carbon (C) or nitrogen (N).

The phase change material has a low-resistance property in a crystalline state and has a high-resistance property in a non-crystalline state. Therefore, data may be stored by a set operation of switching the state of the phase change material from a high-resistance amorphous state to a low-resistance crystalline state and a reset operation of switching the state of the phase change material from a low-resistance crystalline state to a high-resistance amorphous state.

The first and second switching layers 12 and 22 may be a selection element that controls the flow of current according to the magnitude of an applied voltage or current. Therefore, the first and second switching layers 12 and 22 may be implemented to have a characteristic that it allows a current to hardly flow when the magnitude of the applied voltage or current is a predetermined critical value or less, and allows current flow to rapidly increase in substantial proportion to the magnitude of the applied voltage or current when the magnitude of the applied voltage or current exceeds the predetermined critical value.

The first and second switching layers 12 and 22 may be Metal Insulator Transition (MIT) elements, and include $VO_2$, $NbO_2$, $TiO_2$, $WO_2$, $TiO_2$, etc. The first and second switching layers 12 and 22 may be Mixed Ion-Electron Conducting (MIEC) elements, and include $ZrO_2(Y_2O_3)$, $Bi_2O_3$—BaO, $(La_2O_3)_x(CeO_2)_{1-x}$, etc. Also, the first and second switching layers 12 and 22 may be Ovonic Threshold Switching (OST) elements, and include a chalgonide-based material such as $As_2Te_3$, $As_2$ or $As_2Se_3$ or include $TiO_2$, $Ti_4O_7$, $TaO_2$, $Ta_2O_5$, $NiO2$, $HfO_2$, Ge, Sb, Te, etc.

The first lower electrode 11 may be electrically connected to the first row line 10, the first intermediate electrode 13 may be interposed between the first switching layer 12 and the first variable resistance layer 14, and the first upper electrode 15 may be electrically connected to the first column line 16. The second lower electrode 21 may be electrically connected to the second column line 26, the second intermediate electrode 23 may be interposed between the second switching layer 22 and the second variable resistance layer 24, and the second upper electrode 25 may be electrically connected to the second row line 20.

The first and second lower electrodes 11 and 21, the first and second intermediate electrodes 13 and 23, and the first and second upper electrodes 15 and 25 may include a conductive material such as a metal or a metal oxide. For example, each of the first and second lower electrodes 11 and 21, the first and second intermediate electrodes 13 and 23, and the first and second upper electrodes 15 and 25 may include tungsten (W), tungsten nitride (WN), tungsten silicide (WSi), titanium (Ti), titanium nitride ($WN_x$), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), etc., and include any combination thereof.

Each of the first and second lower electrodes 11 and 21, the first and second intermediate electrodes 13 and 23, and the first and second upper electrodes 15 and 25 may have a single- or multi-layered structure. A barrier layer 19 may be interposed between the first upper electrode 15 and the first variable resistance layer 14, and a barrier layer 29 may be interposed between the second upper electrode 25 and the second variable resistance layer 24. Also, the first and second lower electrodes 11 and 21, the first and second intermediate electrodes 13 and 23, and the first and second upper electrodes 15 and 25 may substantially have the same thickness or different thicknesses. In addition, the configurations of the first and second memory cells MC1 and MC2 may be variously modified. For example, at least one of the first lower electrode 11, the first intermediate electrode 13, and the first upper electrode 15 in the first deck D1 may be omitted, and at least one of the second lower electrode 21, the second intermediate electrode 23, and the second upper electrode 25 in the second deck D2 may be omitted.

The first and second protective layers 17 and 27 are used to protect the memory cells MC1 and MC2 in a fabricating process of the electronic device, and may be formed on sidewalls of the memory cells MC1 and MC2. The first and second protective layers 17 and 27 may be formed of a non-conductive material, and include oxide, nitride, poly-silicon, etc. For example, the first and second protective layers 17 and 27 may include silicon oxide ($SiO_x$), silicon nitride ($Si_3N_4$), poly-silicon, titanium nitride (TiN), tantalum nitride (TaN), etc., and include any combination thereof. Also, each of the first and second protective layers 17 and 27 may be provided in a single layer or multi-layer.

The first and second insulating layers 18 and 28 may be formed between adjacent memory cells MC1 and MC2, and be formed to fill a space between the adjacent memory cells MC1 and MC2. The first and second insulating layers 18 and 28 may include an oxide such as silicon oxide ($SiO_2$), include a flowable oxide layer such as a Spin On Coating (SOC) layer or a Spin On Dielectric (SOD) layer, or include any combination thereof.

According to the structure described above, the overlapping ratio of the first column lines 16 and the second column lines 26 can be controlled according to a current path. Thus, the inequality of RC delays between the memory cells MC1 and MC2 can be reduced, and an over-current can be prevented from flowing in a memory cell having a short current path.

Figure 7:
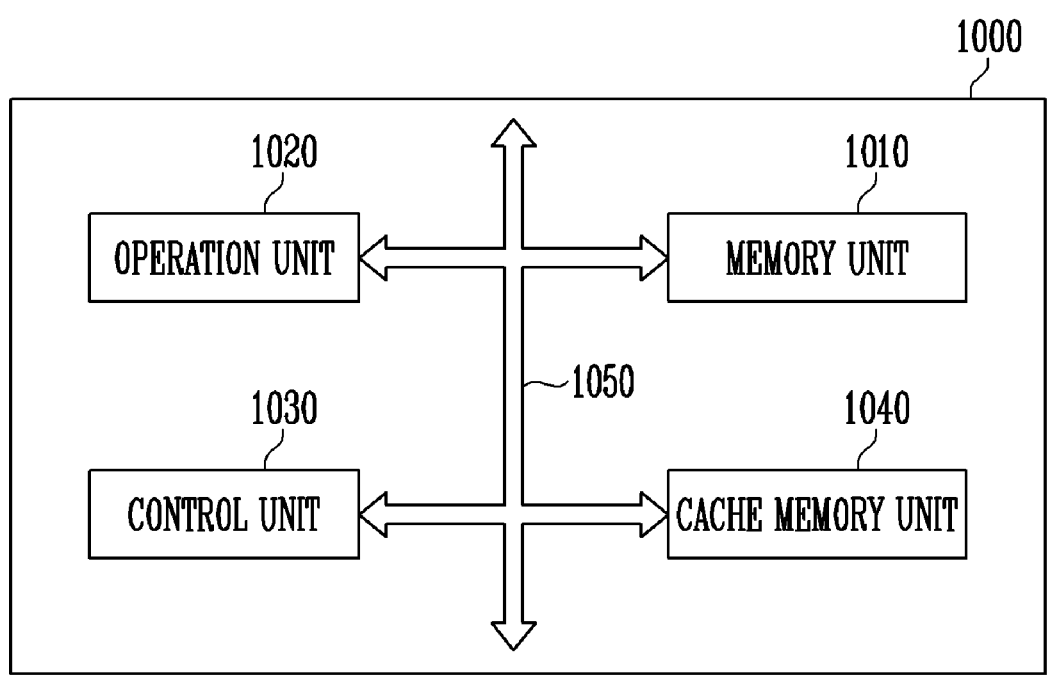
FIG. 7 is a configuration view of a microprocessor implementing a memory device in accordance with an embodiment of the present disclosure.

FIG. 7 is a configuration view of a microprocessor implementing a memory device in accordance with an embodiment of the present disclosure.

Referring to FIG. 7, the microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the embodiments. For example, the memory unit 1010 may include: first column lines extending in a first direction; first row lines extending in a second direction intersecting the first direction; first memory cells located between the first row lines and the first column lines; second column lines electrically connected to the first column lines, the second column lines extending in the first direction; second row lines extending in the second direction, and second memory cells located between the second row lines and the second column lines. The first column lines and the second column lines may overlap with each other in a third direction intersecting the first direction and the second direction, and an overlapping ratio of a second column line belonging to a region in which a current path on the second row lines is relatively short with a first column line may be smaller than that of a second column line belonging to a region in which a current path on the second row lines is relatively long with the first column line. Accordingly, read operation characteristics of the memory unit 1010 can be improved. Consequently, read operation characteristics of the microprocessor 1000 can be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 in accordance with this embodiment may additionally include a cache memory unit 1040 which can temporarily store data to be inputted from an external device other than the memory unit 1010 or to be outputted to an external device. The cache memory unit 1040 may exchange data with the memory unit 1010, the operation unit 1020 and the control unit 1030 through a bus interface 1050.

Figure 8:
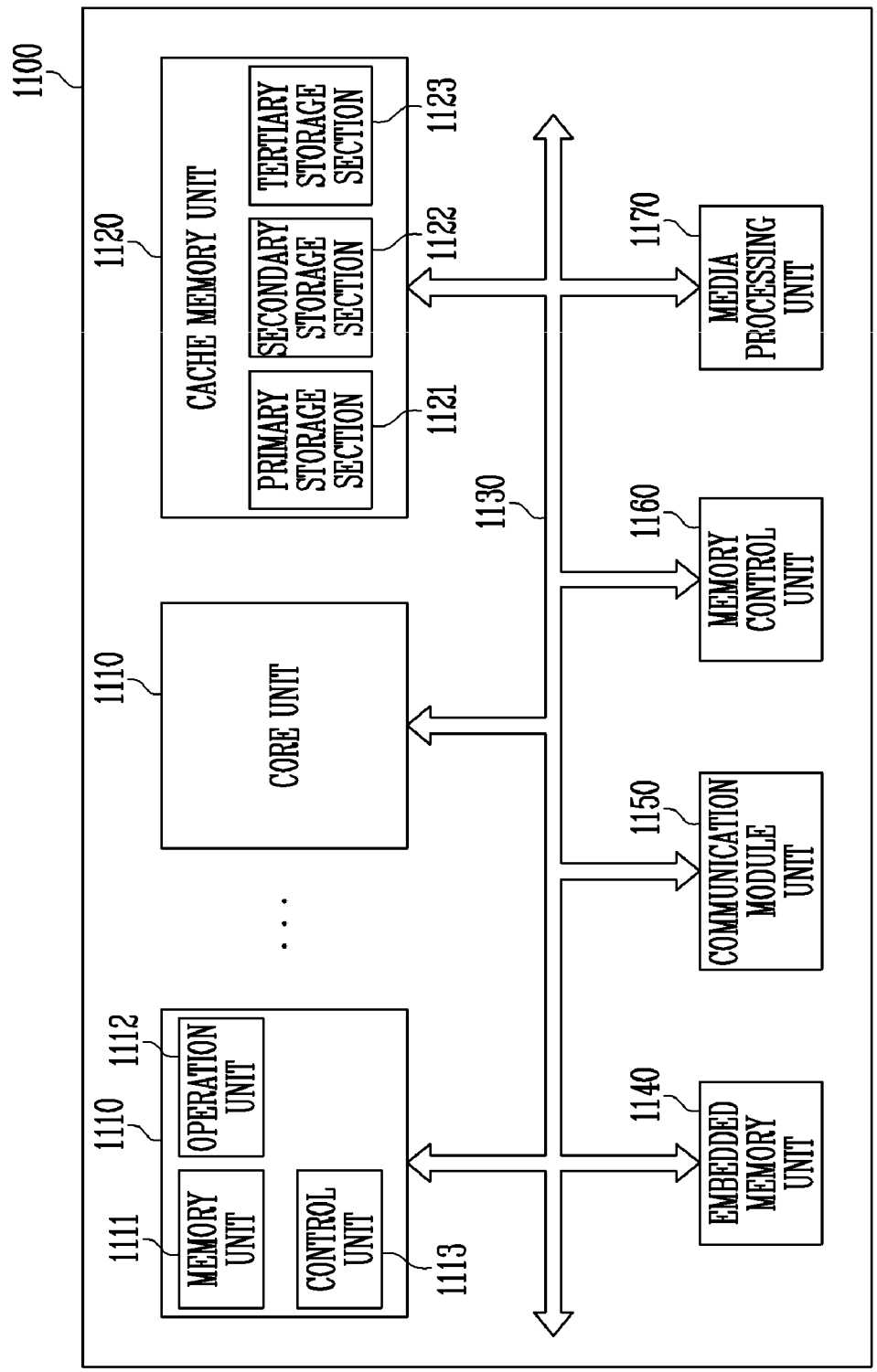
FIG. 8 is a configuration view of a processor implementing a memory device in accordance with an embodiment of the present disclosure.

FIG. 8 is a configuration view of a processor implementing a memory device in accordance with an embodiment of the present disclosure.

Referring to FIG. 8, the processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this embodiment is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the embodiments. For example, the cache memory unit 1120 may include: first column lines extending in a first direction; first row lines extending in a second direction intersecting the first direction; first memory cells located between the first row lines and the first column lines; second column lines electrically connected to the first column lines, the second column lines extending in the first direction; second row lines extending in the second direction, and second memory cells located between the second row lines and the second column lines. The first column lines and the second column lines may overlap with each other in a third direction intersecting the first direction and the second direction, and an overlapping ratio of a second column line belonging to a region in which a current path on the second row lines is relatively short with a first column line may be smaller than that of a second column line belonging to a region in which a current path on the second row lines is relatively long with the first column line. Accordingly, read operation characteristics of the cache memory unit 1120 can be improved. Consequently, read operation characteristics of the processor 1100 can be improved.

Although a case where all the primary, secondary and tertiary storage sections 1121, 1122 and 1123 are configured inside the cache memory unit 1120 is illustrated in FIG. 6, all the primary, secondary and tertiary storage sections 1121, 1122 and 1123 of the cache memory unit 1120 may be configured outside the core unit 1110 and may compensate for a difference in data processing speed between the core unit 1110 and the external device. Alternatively, the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. Alternatively, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 in accordance with this embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another embodiment, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 in accordance with this embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. The plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
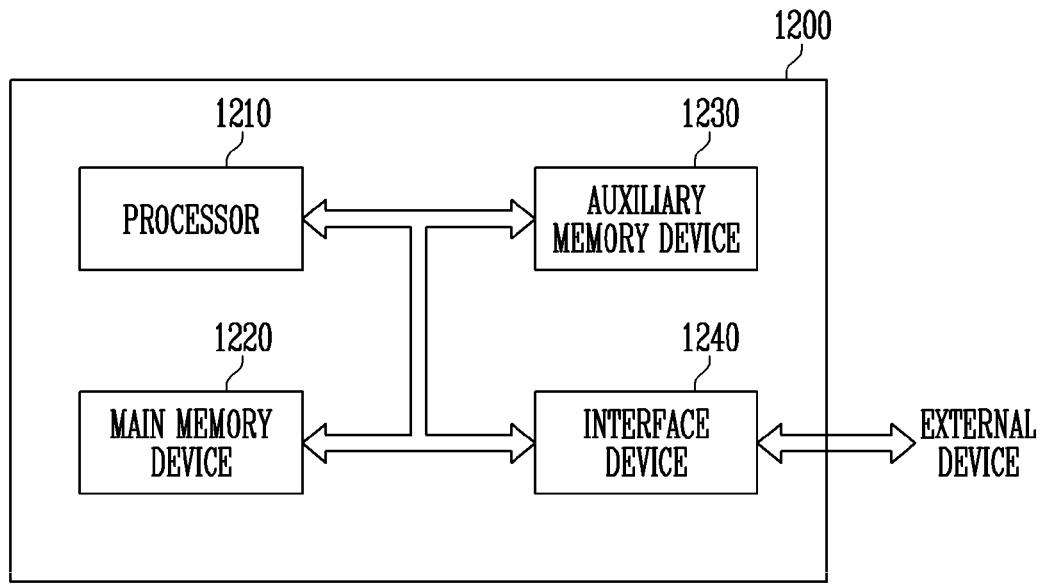
FIG. 9 is a configuration view of a system implementing a memory device in accordance with an embodiment of the present disclosure.

FIG. 9 is a configuration view of a system implementing a memory device in accordance with an embodiment of the present disclosure.

Referring to FIG. 9, the system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the embodiments. For example, the main memory device 1220 may include: first column lines extending in a first direction; first row lines extending in a second direction intersecting the first direction; first memory cells located between the first row lines and the first column lines; second column lines electrically connected to the first column lines, the second column lines extending in the first direction; second row lines extending in the second direction, and second memory cells located between the second row lines and the second column lines. The first column lines and the second column lines may overlap with each other in a third direction intersecting the first direction and the second direction, and an overlapping ratio of a second column line belonging to a region in which a current path on the second row lines is relatively short with a first column line may be smaller than that of a second column line belonging to a region in which a current path on the second row lines is relatively long with the first column line. Accordingly, read operation characteristics of the main memory device 1220 can be improved. Consequently, read operation characteristics of the system 1200 can be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices in accordance with the embodiments, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the embodiments. For example, the auxiliary memory device 1230 may include: first column lines extending in a first direction; first row lines extending in a second direction intersecting the first direction; first memory cells located between the first row lines and the first column lines; second column lines electrically connected to the first column lines, the second column lines extending in the first direction; second row lines extending in the second direction, and second memory cells located between the second row lines and the second column lines. The first column lines and the second column lines may overlap with each other in a third direction intersecting the first direction and the second direction, and an overlapping ratio of a second column line belonging to a region in which a current path on the second row lines is relatively short with a first column line may be smaller than that of a second column line belonging to a region in which a current path on the second row lines is relatively long with the first column line. Accordingly, read operation characteristics of the auxiliary memory device 1230 can be improved. Consequently, read operation characteristics of the system 1200 can be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices in accordance with the embodiments, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this embodiment and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
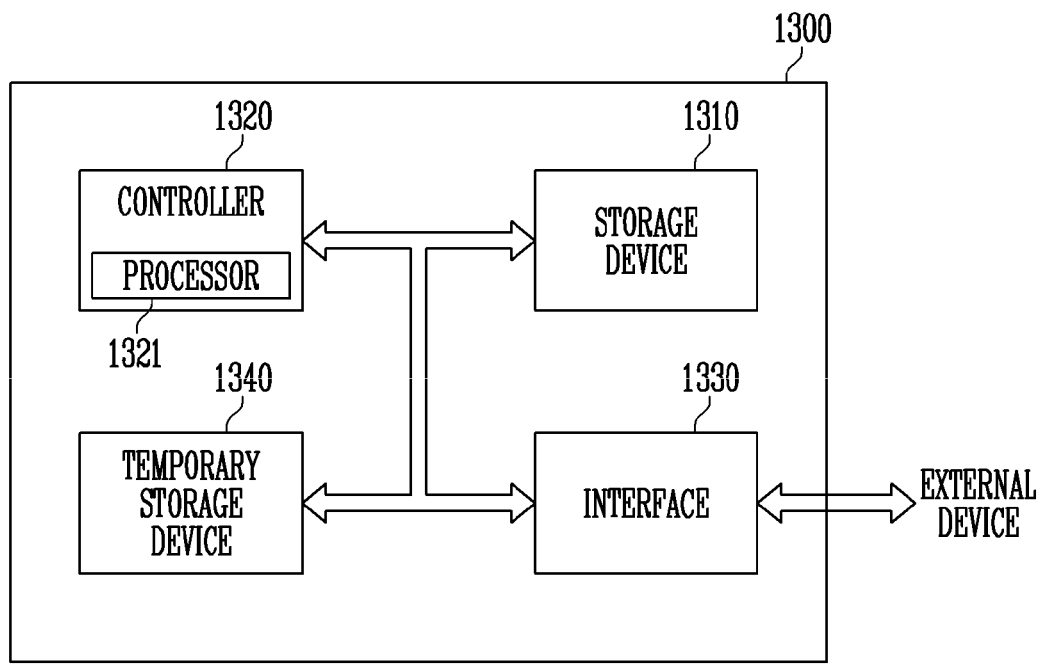
FIG. 10 is a configuration view of a data storage system implementing a memory device in accordance with an embodiment of the present disclosure.

FIG. 10 is a configuration view of a data storage system implementing a memory device in accordance with an embodiment of the present disclosure.

Referring to FIG. 10, the data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the embodiments. For example, the temporary storage device 1340 may include: first column lines extending in a first direction; first row lines extending in a second direction intersecting the first direction; first memory cells located between the first row lines and the first column lines; second column lines electrically connected to the first column lines, the second column lines extending in the first direction; second row lines extending in the second direction, and second memory cells located between the second row lines and the second column lines. The first column lines and the second column lines may overlap with each other in a third direction intersecting the first direction and the second direction, and an overlapping ratio of a second column line belonging to a region in which a current path on the second row lines is relatively short with a first column line may be smaller than that of a second column line belonging to a region in which a current path on the second row lines is relatively long with the first column line. Accordingly, read operation characteristics of the temporary storage device 1340 can be improved. Consequently, read operation characteristics of the data storage system 1300 can be improved.

Figure 11:
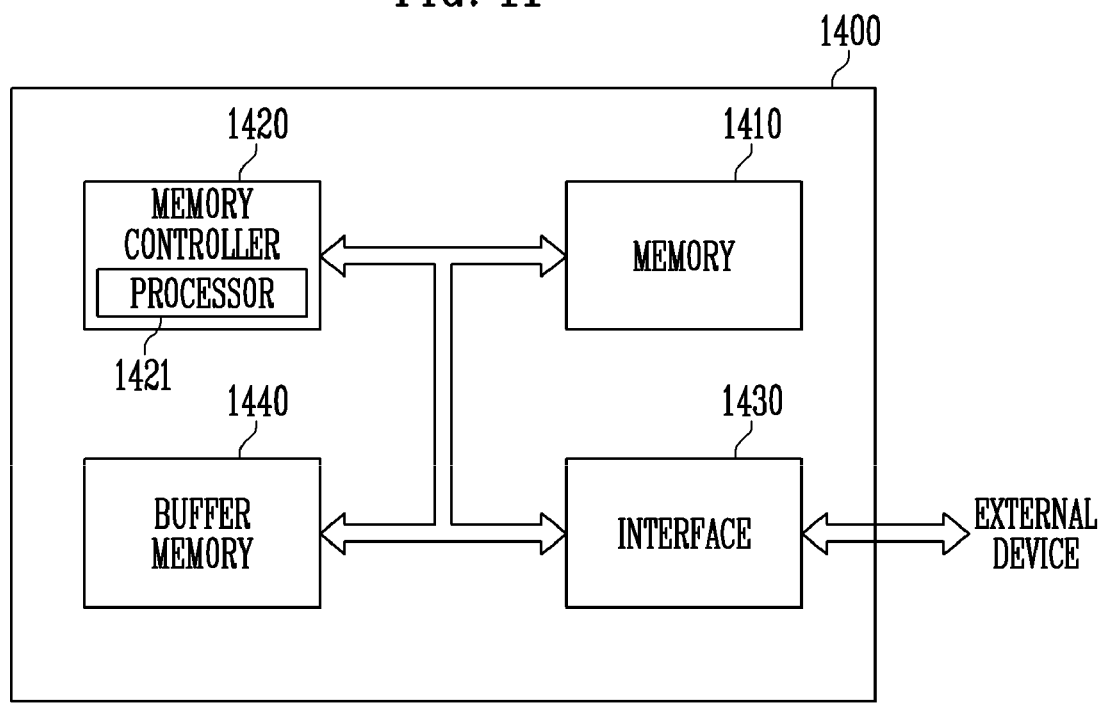
FIG. 11 is a configuration view of a memory system implementing a memory device in accordance with an embodiment of the present disclosure.

FIG. 11 is a configuration view of a memory system implementing a memory device in accordance with an embodiment of the present disclosure.

Referring to FIG. 11, the memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the embodiments. For example, the memory 1410 may include: first column lines extending in a first direction; first row lines extending in a second direction intersecting the first direction; first memory cells located between the first row lines and the first column lines; second column lines electrically connected to the first column lines, the second column lines extending in the first direction; second row lines extending in the second direction, and second memory cells located between the second row lines and the second column lines. The first column lines and the second column lines may overlap with each other in a third direction intersecting the first direction and the second direction, and an overlapping ratio of a second column line belonging to a region in which a current path on the second row lines is relatively short with a first column line may be smaller than that of a second column line belonging to a region in which a current path on the second row lines is relatively long with the first column line. Accordingly, read operation characteristics of the memory 1410 can be improved. Consequently, read operation characteristics of the memory system 1400 can be improved.

Also, the memory 1410 of this embodiment may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 of this embodiment may further include a buffer memory 1440 for efficiently transferring data between the interface 1430 and the memory 1410 according to diversification and high performance of an interface with an external device, a memory controller and a memory system. The buffer memory 1440 for temporarily storing data may include one or more of the above-described semiconductor devices in accordance with the embodiments. For example, the buffer memory 1440 may include: first column lines extending in a first direction; first row lines extending in a second direction intersecting the first direction; first memory cells located between the first row lines and the first column lines; second column lines electrically connected to the first column lines, the second column lines extending in the first direction; second row lines extending in the second direction, and second memory cells located between the second row lines and the second column lines. The first column lines and the second column lines may overlap with each other in a third direction intersecting the first direction and the second direction, and an overlapping ratio of a second column line belonging to a region in which a current path on the second row lines is relatively short with a first column line may be smaller than that of a second column line belonging to a region in which a current path on the second row lines is relatively long with the first column line. Accordingly, read operation characteristics of the buffer memory 1440 can be improved. Consequently, read operation characteristics of the memory system 1400 can be improved.

Moreover, the buffer memory 1440 of this embodiment may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices in accordance with the embodiments, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

In the electronic device in accordance with the present disclosure, the operational characteristics and reliability of memory cells can be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An electronic device comprising a semiconductor memory,
wherein the semiconductor memory includes:
first column lines extending in a first direction;
first row lines extending in a second direction intersecting the first direction;
first memory cells located between the first row lines and the first column lines;
second column lines electrically connected to the first column lines, the second column lines extending in the first direction;
second row lines extending in the second direction; and
second memory cells located between the second row lines and the second column lines,
wherein the first column lines and the second column lines overlap with each other in a third direction intersecting the first direction and the second direction,
wherein a first second column line belongs to a region in which current paths on the second row lines are shorter than current paths on the second row lines in a region a second second column line belongs to, and
wherein an overlapping ratio of the first second column line with a first first column line is smaller than an overlapping ratio of the second second column line with a second first column line.

2. The electronic device of claim 1, wherein a first region to an nth region are sequentially defined along the second direction, and the overlapping ratio of the first column lines and the second column lines decreases as approaching the first region from the nth region,
wherein n is an integer of 2 or more.

3. The electronic device of claim 2, wherein the second column lines are arranged at a first distance in each of the first to nth regions.

4. The electronic device of claim 3, wherein the second column lines are arranged at a second distance wider than the first distance, at boundaries between the first to nth regions.

5. The electronic device of claim 1, further comprising:
a row circuit; and
contact plugs electrically connecting the row circuit and the second row lines,
wherein the region which the first second column line belongs to is closer to the contact plugs than the region which the second second column line belongs to.

6. The electronic device of claim 1, wherein the first row lines, the first column lines, the second column lines, and the second row lines are sequentially stacked.

7. The electronic device of claim 1, wherein the second row lines, the second column lines, the first column lines, and the first row lines are sequentially stacked.

8. The electronic device of claim 1, wherein the first column lines and the second column lines substantially have the same width in the second direction.

9. An electronic device comprising a semiconductor memory,
wherein the semiconductor memory includes:
first column lines extending in a first direction;
first row lines extending in a second direction intersecting the first direction;
first memory cells located between the first row lines and the first column lines;
second column lines electrically connected to the first column lines, the second column lines extending in the first direction;
second row lines extending in the second direction; and
second memory cells located between the second row lines and the second column lines, wherein the first memory cells and the second memory cells overlap with each other in a third direction intersecting the first and second directions, wherein a first second memory cell belongs to a region in which current paths on the second row lines are shorter than current paths on the second row lines in a region which a second second memory cell belongs to, and wherein an overlapping ratio of the first second memory cell with a first first memory cell is smaller than an overlapping ratio of the second second memory cell with a second first memory cell.

10. The electronic device of claim 9, wherein a first region to an nth region are sequentially defined along the second direction, and the overlapping ratio of the first memory cells and the second memory cells decreases as approaching the first region from the nth region, wherein n is an integer of 2 or more.

11. The electronic device of claim 10, wherein the second column lines are arranged at a first distance in each of the first to nth regions.

12. The electronic device of claim 11, wherein the second column lines are arranged at a second distance wider than the first distance, at boundaries between the first to nth regions.

13. The electronic device of claim 9, further comprising:
a row circuit; and
contact plugs electrically connecting the row circuit and the second row lines,
wherein the region which the first second memory cell belongs to is closer to the contact plugs than the region which the second second memory cell belongs to.

14. The electronic device of claim 9, wherein the first row lines, the first column lines, the second column lines, and the second row lines are sequentially stacked.

15. The electronic device of claim 9, wherein the second row lines, the second column lines, the first column lines, and the first row lines are sequentially stacked.

16. The electronic device of claim 9, wherein the first column lines and the second column lines substantially have the same width in the second direction.

17. The electronic device of claim 9, wherein the first second memory cell and the second second memory cell are coupled to different second column lines.

18. An electronic device comprising a semiconductor memory,
wherein the semiconductor memory includes:
first column lines extending in a first direction;
first row lines extending in a second direction intersecting the first direction;
first memory cells located between the first row lines and the first column lines;
second column lines electrically connected to the first column lines, the second column lines extending in the first direction;
second row lines extending in the second direction; and
second memory cells located between the second row lines and the second column lines,
wherein the first column lines and the second column lines overlap with each other in a third direction intersecting the first direction and the second direction,
wherein a first region to an nth region are defined based on the length of a current path,
wherein an overlapping ratio of first and second column lines belonging to the first region in which the current path is short relative to a current path of the nth region is smaller than an overlapping ratio of first and second column lines belonging to the nth region, and
wherein n is an integer of 2 or more.

19. The electronic device of claim 18, wherein the first region to the nth region are sequentially defined along the second direction.

20. The electronic device of claim 18, wherein the first region to the nth region are sequentially defined along the first direction.

* * * * *